United States Patent
Huang et al.

(10) Patent No.: US 12,300,323 B2
(45) Date of Patent: May 13, 2025

(54) METHOD OF IMPROVING PROGRAM OPERATION SPEED IN 3D NAND SYSTEMS

(71) Applicant: Yangtze Memory Technologies Co., Ltd., Hubei (CN)

(72) Inventors: Ying Huang, Hubei (CN); Hongtao Liu, Hubei (CN); Yuanyuan Min, Hubei (CN); Junbao Wang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 17/937,016

(22) Filed: Sep. 30, 2022

(65) Prior Publication Data

US 2024/0112738 A1 Apr. 4, 2024

(51) Int. Cl.
*G11C 16/10* (2006.01)
*G11C 16/12* (2006.01)

(52) U.S. Cl.
CPC ............ *G11C 16/102* (2013.01); *G11C 16/12* (2013.01)

(58) Field of Classification Search
None
See application file for complete search history.

(56) References Cited

U.S. PATENT DOCUMENTS

| | | | |
|---|---|---|---|
| 2009/0040831 A1* | 2/2009 | Noh | G11C 16/3418 365/185.19 |
| 2022/0076767 A1* | 3/2022 | Guo | G11C 16/24 |
| 2022/0310181 A1* | 9/2022 | Dong | G11C 16/08 |
| 2023/0133227 A1* | 5/2023 | Miccoli | G11C 11/5628 365/189.011 |

* cited by examiner

*Primary Examiner* — Alfredo Bermudez Lozada
(74) *Attorney, Agent, or Firm* — Conley Rose, P.C.

(57) ABSTRACT

In an aspect, a memory device comprises a memory configured to store a program code and a processor. The processor is configured to perform a first programming to a first cell of the memory device by incremental step pulse programming (ISPP) with a first step voltage. The processor is further configured to perform a second programming to a second cell of the memory device by ISPP with a second step voltage. The first step voltage is larger than the second step voltage. The first cell corresponds to a first target voltage and the second cell corresponds to a second target voltage. The first cell corresponds to a first target voltage and the second cell corresponds to a second target voltage.

19 Claims, 12 Drawing Sheets

METHOD OF IMPROVING PROGRAM OPERATION SPEED IN 3D NAND SYSTEMS

TECHNICAL FIELD

This description relates to a memory device and a method for programming operations. Specifically, the memory device and the method improve the efficiency of program operations.

BACKGROUND

A memory device, such as a flash memory chip, can program a memory cell of the memory device by applying a voltage, such as a programming voltage, to the memory cell. The memory device then verifies whether or not the memory cell satisfies a voltage range or a required voltage. For example, the memory device can apply one or more reference voltages to the memory cell to determine a threshold voltage of the memory cell and compare the threshold voltage to the voltage range or the required voltage. In some aspects, memory cells in a same memory page of the memory device shared the same word line and can be programmed simultaneously.

Memory cells may experience an adverse voltage coupling effect. For example, the threshold voltage of a memory cell may change due to programming operations of other memory cells, such as memory cells of other memory pages. In some aspects, the memory cell may suffer from initial threshold voltage shift (IVS), especially for the memory cell with a high threshold voltage.

In more sophisticated designs, the memory device may program the memory cell using multi-stage programming operations. For example, the memory device may perform coarse programming to program the memory cell to an intermediate threshold voltage. The memory device then performs fine programming to program the memory cell to a desired threshold voltage. But the intermediate threshold voltage may suffer from the coupling effect and/or IVS, which can be mitigated by the fine programming.

The multi-stage programming operations improve the accuracy of the programming. For example, the threshold voltage of the memory cell is more likely to be in a range of reference voltages. On the other hand, the multi-stage programming operations require programming the memory cell multiple times, and thus increase the time of the programming operations.

SUMMARY

Some aspects of this disclosure relate to memory devices and methods for programming operations. For example, the memory devices and the methods are provided for improving the efficiency of programming operations.

Some aspects of this disclosure provide programming by using an incremental step pulse programming (ISPP) scheme in which the programming voltage can be incrementally increased by adding a step pulse. In some aspects, the step pulse is also referred to as a step voltage. For example, the memory device verifies the memory cell after a programming voltage is applied to the memory cell. If a threshold voltage of the memory cell does not reach a target programming state, e.g., the threshold voltage is not within a required voltage range, the memory device increases the programming voltage by the step pulse and applies the increased programming voltage to the memory cell. If the threshold voltage of the memory cell reaches the target programming state, e.g., the threshold voltage is within the required voltage range, the memory device inhibits the memory cell.

In some aspects, the memory device performs ISPP for both coarse programming and fine programming with predetermined step pulses. The memory device can increase the programming voltage by a predetermined coarse step pulse if the threshold voltage of the memory cell is not within a required coarse voltage range. In addition, the memory device can increase the programming voltage by a predetermined fine step pulse if the threshold voltage of the memory cell is not within a required fine voltage range.

In some aspects, the memory device performs ISPP for the coarse programming with variable step pulses that are larger than the predetermined step pulses when the memory cell has a low target programming state or a low required voltage range. Using a larger step pulse, the threshold voltage of the memory device may reach the required voltage range with fewer rounds of programming and verifications. On the other hand, the memory device can also use variable step pulses that are close to or equal to the predetermined step pulses when the memory cell has a high target programming state or a high required voltage range because the memory cell may suffer from a severe IVS in such a case. Therefore, the variable step pulses improve the efficiency and ensure the reliability of the programming operations.

This Summary is provided merely for purposes of illustrating some aspects to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings are incorporated herein and form a part of the specification.

Figure 1:
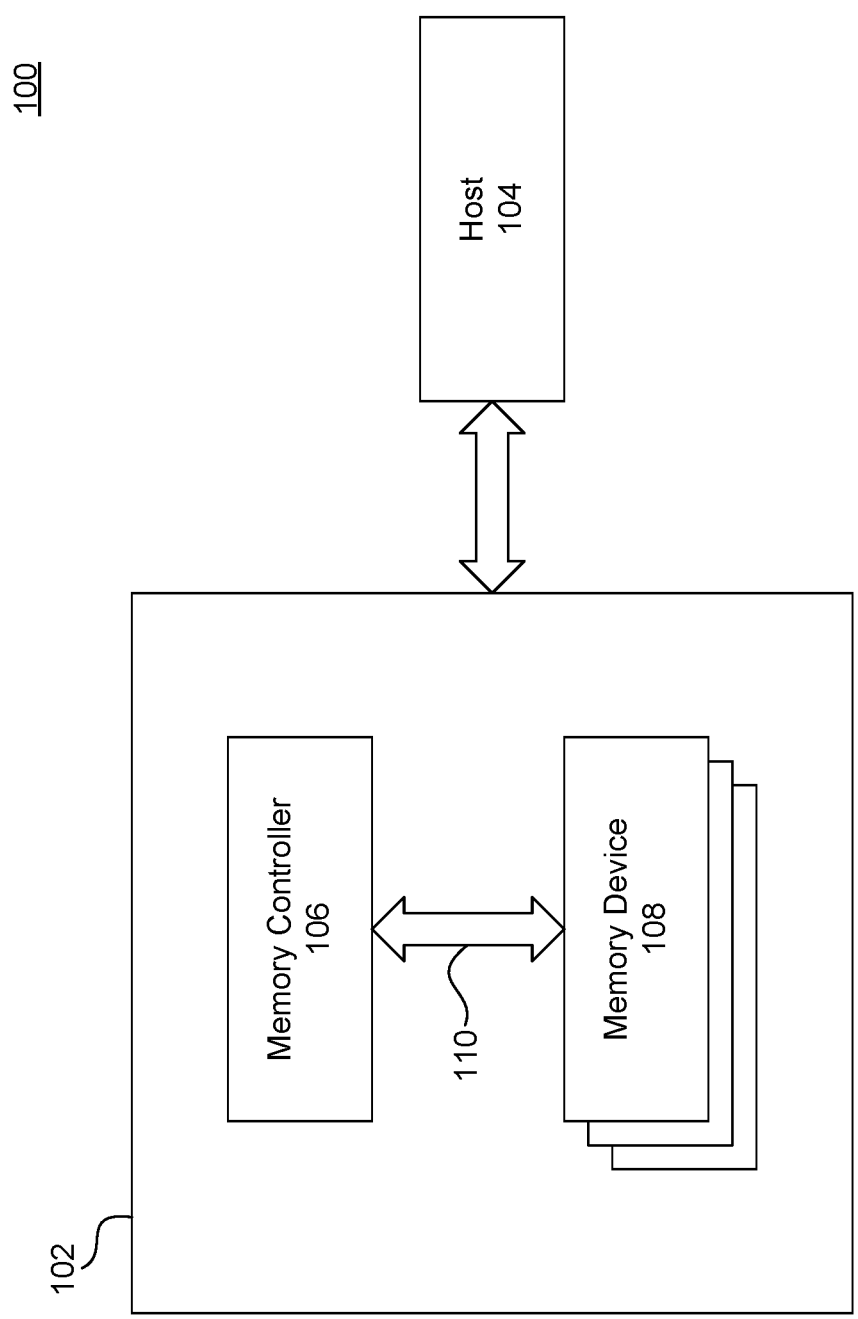
FIG. 1 illustrates an example system including a memory device, according to aspects of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some aspects," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure, or characteristic is described in connection with an embodiment, it would be within the knowledge of a person skilled in the pertinent art to affect such feature, structure, or characteristic in connection with other aspects whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or 30% of the value).

FIG. 1 illustrates an example system 100, according to some aspects of the present disclosure. The system 100 can include, but is not limited to, wireless communication devices, smartphones, laptops, desktops, tablets, personal assistant devices, monitors, televisions, wearable devices, Internet of Things (IoT) devices, vehicle communication devices, and the like. The system 100 includes a memory system 102 and a host 104. In some aspects, the memory system 102 can also be referred to as a solid state drive (SSD), which includes a memory device 108 and a memory controller 106. The one or more memory devices can communicate with the host 104 through the memory controller 106, where the memory controller 106 can be connected to the memory device 108 via a memory channel 110. In some aspects, the memory system 102 can have more than one memory devices 108, while each memory device 108 can be managed by the memory controller 106. In some aspects, the memory controller 106 includes one or more processors.

The host 104 sends data to be stored at the memory system 102 or retrieves data by reading the memory system 102. The memory controller 106 can handle I/O requests received from the host 104, ensure data integrity and efficient storage, and manage the memory device 108. The memory channel 110 can provide data and control communications between the memory controller 106 and the one or more memory devices 108 via a data bus.

The memory device 108 (i.e., "flash," "NAND flash" or "NAND") can be a memory chip (package), a memory die or any portion of a memory die, and can include one or more memory planes, each of which can include a plurality of memory blocks. Identical and concurrent operations can take place at each memory plane. The memory block, which can be megabytes (MB) in size, is the smallest size to carry out erase operations. In some aspects, the memory device 108 includes four memory planes and each memory plane includes six memory blocks. Each memory block can include a plurality of memory cells, where each memory cell can be addressed through interconnections such as bit lines and word lines. The bit lines and word lines can be laid out perpendicularly (e.g., in rows and columns, respectively), forming an array of metal lines. In this disclosure, the memory block is also referred to as the "memory array" or "array." The memory array is the core area in a memory device, performing storage functions.

Figure 2:
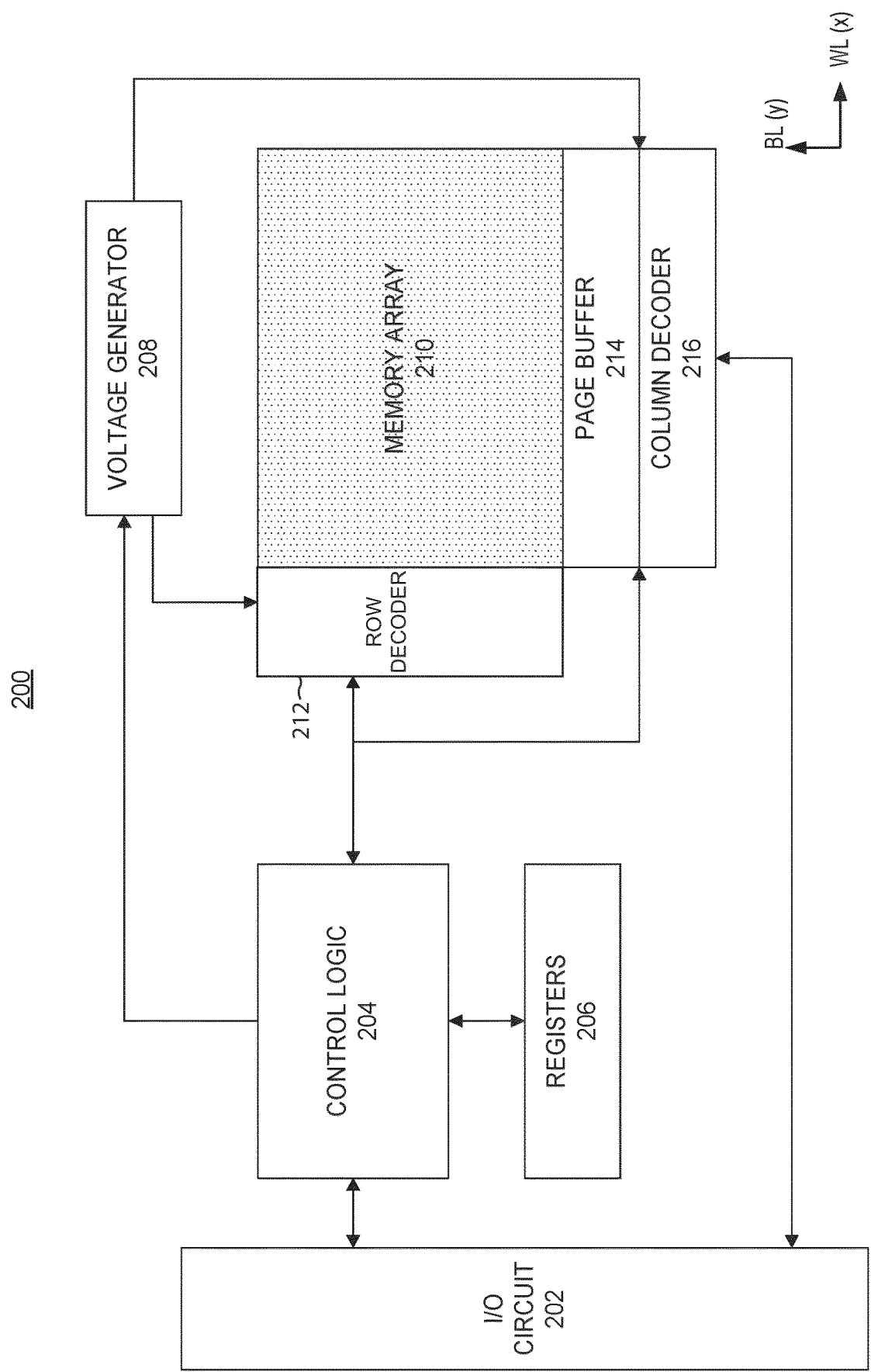
FIG. 2 illustrates an example block diagram of a memory device, according to aspects of the present disclosure.

FIG. 2 illustrates an example block diagram of a memory device 200, according to aspects of the present disclosure. In some aspects, the memory device 200 can be an example of the memory device 108 of FIG. 1. As shown in FIG. 2, the memory device 200 includes digital, analog, and/or mixed-signal circuits to support functions of a memory array 210, for example, row decoders 212, page buffers 214, and column decoders 216. The memory device 200 can also include I/O circuit 202, a control logic 204, a register 206, and a voltage generator 208. The control logic 204 can be configured to control other components of the memory device 200. For example, the control logic 204 can control the voltage generator 208, which generates voltages to be applied to memory cells of the memory array 210. The registers 206 can be coupled to the control logic 204 and include registration information, such as address information. In some aspects, the memory device 200 can communicate with a host, such as the host 104 of FIG. 1 via the I/O circuit 202. For example, the memory device 200 can receive commands from the host via the I/O circuit 202 and/or transmit data retrieved from the memory array 210 to the host.

It is noted that the layout of the electronic components in the memory system 102 of FIG. 1 and the memory device 200 of FIG. 2 are shown as an example. The memory system 102 and the memory device 200 can have other layouts and can include additional components.

Figure 3:
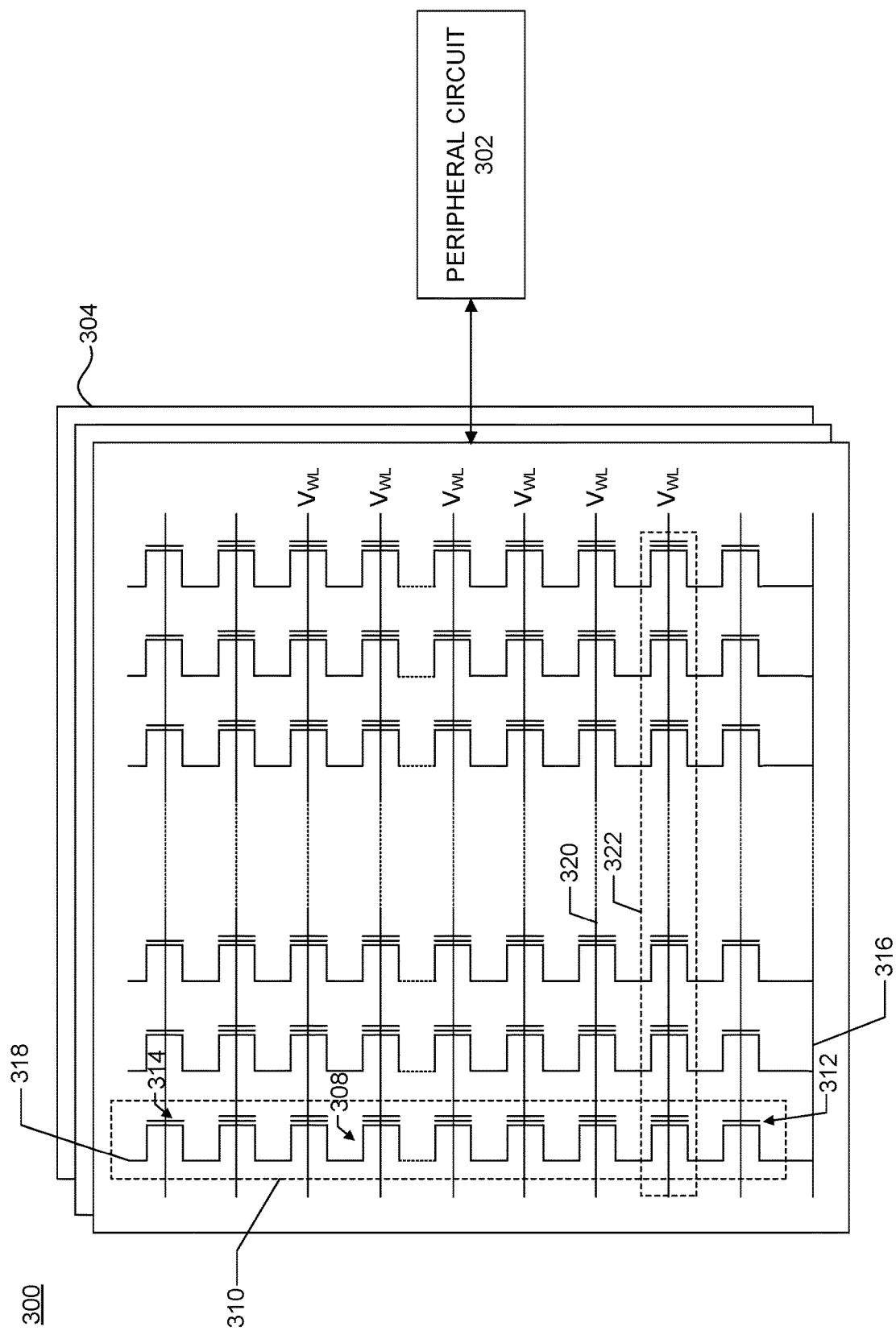
FIG. 3 illustrates an example schematic circuit diagram of a memory device, according to aspects of the present disclosure.

FIG. 3 illustrates an example schematic circuit diagram 300 of a memory device, according to aspects of the present disclosure. The example schematic circuit diagram 300 includes a memory cell array 304 and a peripheral circuit 302. In some aspects, the example schematic circuit diagram 300 includes a plurality of memory strings 310, each memory string 310 having a plurality of memory cells 308. The memory string 310 also includes at least one field effect transistor (e.g., MOSFET) at each end, which is controlled by a lower select gate (LSG) 312 and a top select gate (TSG) 314, respectively. The memory cell 308 can be controlled by a control gate, where the control gate can be connected to a word line 320 of the example schematic circuit diagram 300. The drain terminal of the TSG 314 can be connected to the bit line 318, and the source terminal of the LSG 312 can be connected to an array common source (ACS) 316. The ACS 316 can be shared by the memory strings 310 in an entire memory block, and is also referred to as the common source line.

In some aspects, the example schematic circuit diagram 300 can be formed based on the floating gate technology. In some aspects, the example schematic circuit diagram 300 can be formed based on charge trapping technology. The NAND flash memory based on charge trapping can provide high storage density and high intrinsic reliability. Storage data or logic states (e.g., threshold voltage $V_{th}$ of the memory cell 308) depends on the amount of charge trapped in a storage layer. In some aspects, the memory array 210 can be a three-dimensional (3D) memory device, and the example schematic circuit diagram 300 can be a 3D memory array, where the memory cells 308 can be vertically stacked on top of each other.

In a NAND flash memory, read and write operations can be performed in a memory page 322, which includes all memory cells 308 sharing the same word line. In a NAND memory, the memory cell 308 can be in an erase state ER or a programmed state P1. Initially, all memory cells 308 in the example schematic circuit diagram 300 can be reset to the erase state ER as logic "1" by implementing a negative voltage difference between control gates and source terminals of the memory cells (e.g., the array common source 316) such that all the trapped electronic charges in the storage layer of the memory cells 308 can be removed. For example, the negative voltage difference can be induced by setting the control gates of the memory cells 308 to ground, and applying a high positive voltage to the array common source 316. At the erase state ER ("state ER"), the threshold voltage $V_{th}$ of the memory cells 308 can be reset to the lowest value, and can be measured or sensed at the bit line 318.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 308, and thereby increase the threshold voltage $V_{th}$ of the memory cell 308. Thus the memory cell 308 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 4:
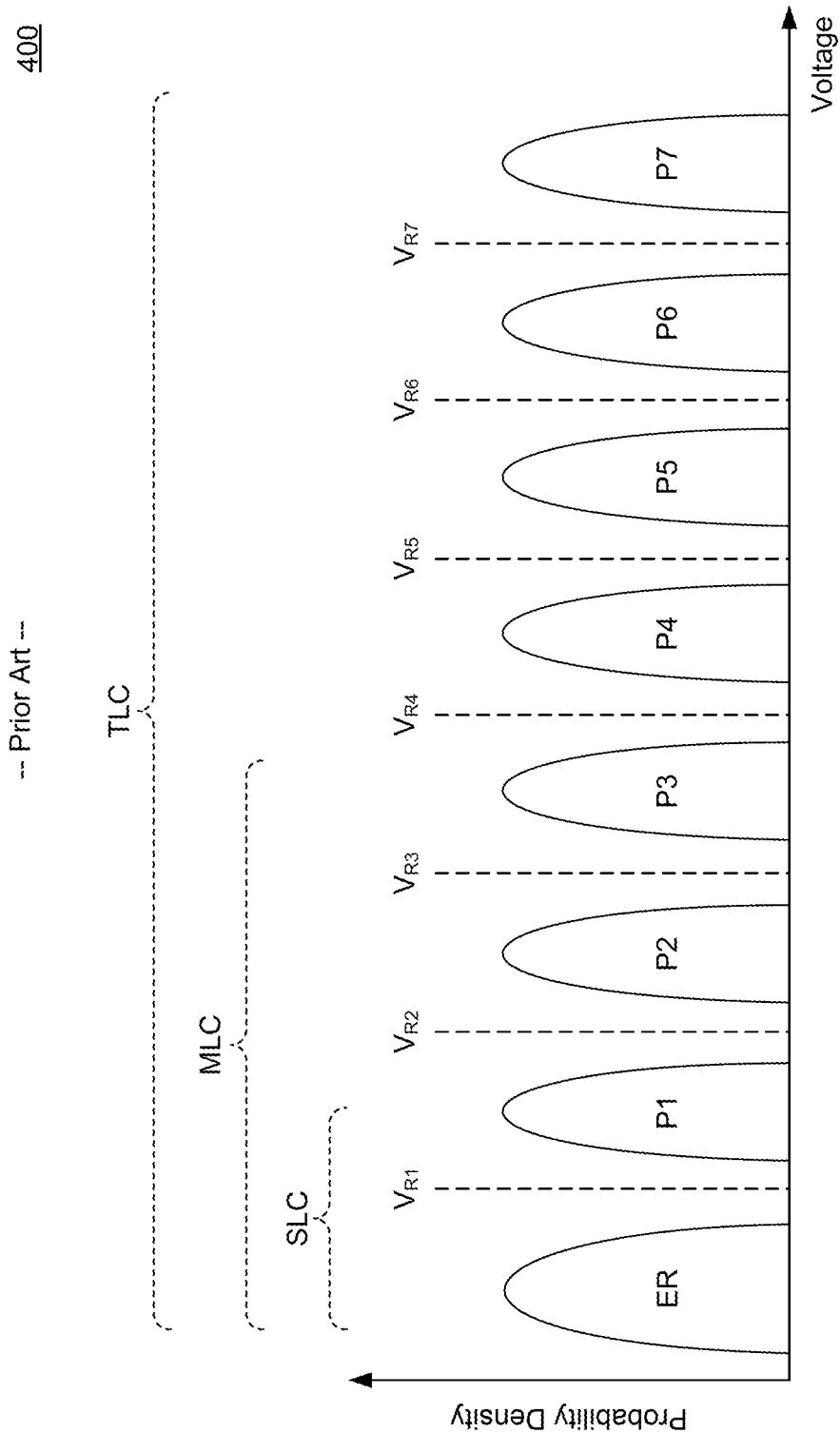
FIG. 4 illustrates an example threshold voltage distribution of a memory device, according to aspects of the present disclosure.

FIG. 4 illustrates a threshold voltage $V_{th}$ distribution of a NAND flash memory programmed in the triple-level cell (TLC) mode, according to some aspects of the present disclosure. Due to various variations, each state of the memory cells includes a range of threshold voltages $V_{th}$ (x-axis), where the threshold voltage $V_{th}$ distribution of each state can be represented by a probability density (y-axis). In some aspects, the eight TLC states can be programmed by using an incremental step pulse programming (ISPP) scheme in which the programming voltage $V_{pgm}$ can be incrementally increased by adding a step pulse $V_{step}$. Accordingly, the eight TLC states can be programmed from the state P1 with a lower threshold voltage to the state P7 with a highest threshold voltage. In some aspects, the eight TLC states can reach the state P7 in a shorter amount of time using an ISPP with a larger step pulse $V_{step}$.

In some aspects, to increase the programming speed, memory cells in the same memory page 322 (FIG. 3) shared with the same word line (e.g., same control gates) can be programmed simultaneously. After each ISPP pulse, a verify read can be performed. In some aspects, the memory cells which have reached a target state (i.e., a target threshold voltage) can be inhibited from further programming by controlling the TSG 314 and/or LSG 312. In some aspects, memory cells can also be inhibited from further programming by raising the voltage on the corresponding bit lines.

After programming, the eight TLC states ER and P1-P7 can be verified by using one or more read reference voltages $V_{R1}$-$V_{R7}$. By applying one or more of the read reference voltages $V_{R1}$-$V_{R7}$ to the control gate of a target memory cell, the range of the memory cell's threshold voltage $V_{th}$ can be determined. For example, to verify if a target memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switched on and form a conductive path in the channel. If the target memory cell is at any one of the states P1-P7, the threshold voltage $V_{th}$ of the target memory cell is higher than the read reference voltage $V_{R1}$. The target memory cell is thereby switched off. By measuring or sensing the current through the target memory cell at the corresponding bit line, the threshold voltage $V_{th}$ or the state of the target memory cell can be verified.

As described above, to determine the two states ER and P1 stored in the SLC mode, only the read reference voltage $V_{R1}$ is needed. To determine the four states ER and P1-P3 in the MLC mode, the read reference voltages $V_{R1}$, $V_{R2}$, and $V_{R3}$ can be used. To determine the eight states ER and P1-P7 for the TLC mode, the read reference voltages $V_{R1}$-$V_{R7}$ can be used. For example, in the TLC mode, the threshold voltage of state ER is below $V_{R1}$, and the threshold voltage of state P7 is above $V_{R7}$, where the threshold voltages of state P1 are between $V_{R1}$ and $V_{R2}$. States P2-P6 can be determined similarly.

In some aspects, to improve reading and programming speed, multiple memory pages ("physical pages") can be read or programmed simultaneously. In MLC, TLC, or QLC mode, each memory page can be read or programmed based on one or more logic pages. For example, in the TLC mode of 3 bits per memory cell, a memory page can be programmed based on 3 logic pages, e.g., a lower page, a middle page, and an upper page.

Figure 5:
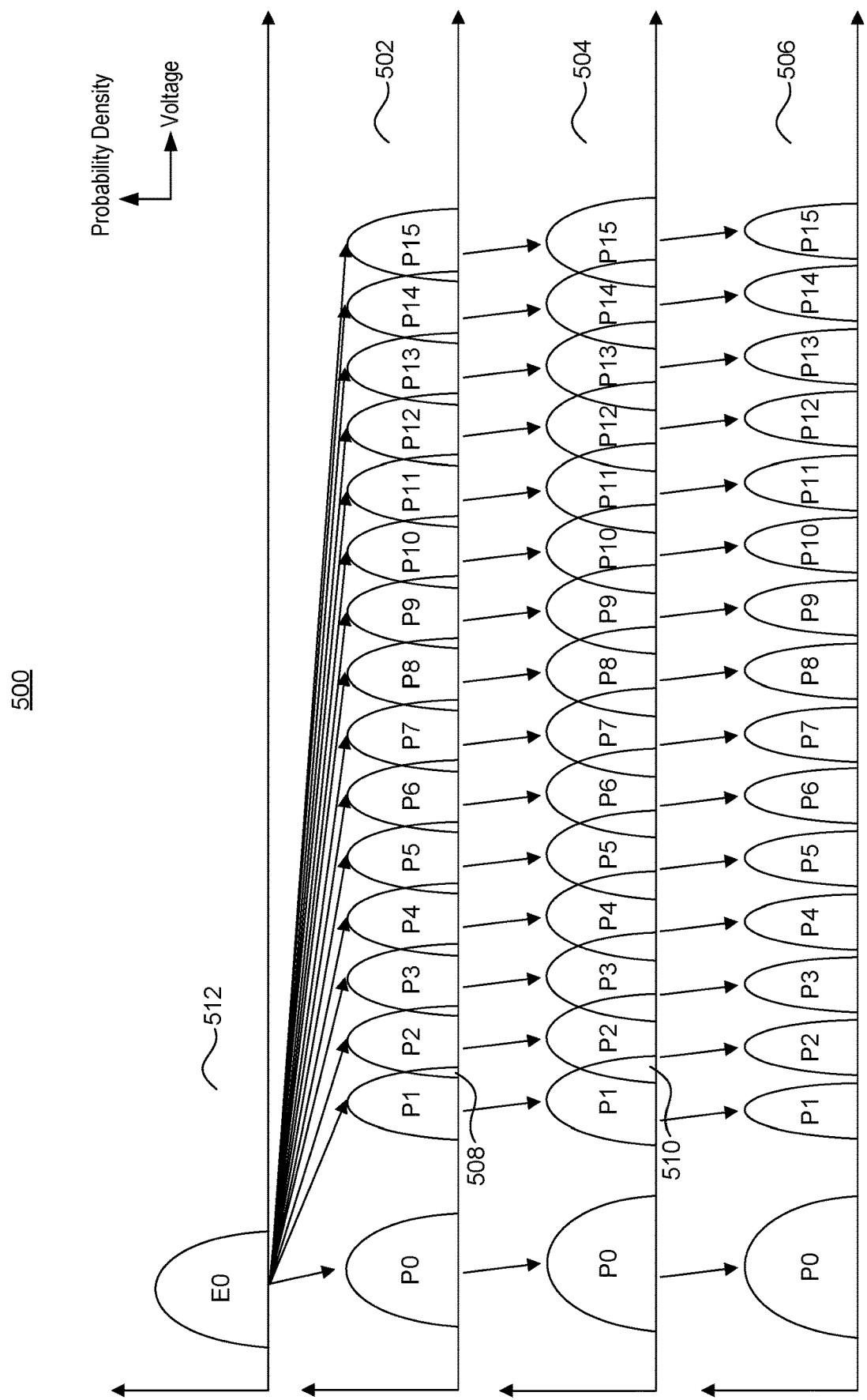
FIG. 5 illustrates an example threshold voltage distributions of a memory cell in 16-16 multi-stage programming, according to aspects of the present disclosure.

FIG. 5 illustrates an example threshold voltage distributions 500 of a memory cell in 16-16 multi-stage programming, according to aspects of the present disclosure. FIG. 5 can be described with regard to elements of FIGS. 1, 2, 3, and 12. The example threshold voltage distributions 500 can be performed by a memory system (for example, the memory system 102 of FIG. 1). The example threshold voltage distributions 500 includes plots 512, 502, 504, and 506. Each of the plots include an x-axis representing voltages levels and a y-axis representing probability densities. The plot 512 shows a threshold voltage distribution of the memory cell before performing any programming operations. The plot 502 shows the threshold voltage distribution of the memory cell after coarse programming of the memory cell. The plot 504 shows the threshold voltage distribution of the memory cell after coarse programming of a neighboring cell. The plot 506 shows the threshold voltage distribution of the memory cell after fine programming of the memory cell. Arrows between the plots represent possible changes between states. For example, arrows between an E0 of 512 and states P0-P15 of 502 shows that the threshold voltage of the memory cell can be programmed from the E0 state to any of the states P0-P15 in coarse programming.

In some aspects, a memory cell can store data in a QLC mode. In such a case, the memory cell can be programed to be in one of 16 states, namely, the P0-P15 states. In some aspects, the P0 state is also referred to as an ER state. The memory cell can be in the E0 state and the threshold voltage distribution of the memory cell in the E0 state is shown in 512. The memory device can perform a coarse program to program the memory cell from the E0 state to one of the 16 states P0-P15 so that the threshold voltage distribution can be in one of 16 voltage ranges corresponding to the states P0-P15 of 502. In some aspects, the 16 voltage ranges may overlap with each other. For example, the voltage range of P1 overlaps with the voltage range of P2 in a voltage range 508. In case the threshold voltage of the memory cell is in the voltage range 508, it is difficult to determine which state the memory cell is in. Thus, after the coarse programming, it may be difficult to determine data stored in the memory cell in such a case. In some aspects, each state corresponds to a target coarse voltage. For example, the state P1 can correspond to a target coarse voltage that is a lower bound of the state P1 distribution shown in 502 of FIG. 5. To program a memory cell with a target state P1, the memory device programs the memory cell so that its threshold voltage is higher than the target coarse voltage of the state P1.

In some aspects, after the coarse programming of the memory cell shown in 502, the memory device can perform coarse programming of the neighboring memory cell. For example, the memory cell can be connected to a word line n and the neighboring cell can be connected to a word line n+1. Therefore, the memory cell and the neighboring cell can be physically located close to each other in the memory device. In such a case, the coarse programming of the neighboring memory cell can have a coupling effect on the memory cell. For example, 504 of FIG. 5 shows the 16 voltage ranges of the coarse programming that the threshold voltage of the memory cell may be in after the coarse programming of the neighboring memory cell. It can be seen that each of the 16 voltage ranges of 504 is wider than those of 502. In addition, overlapping ranges between two neighboring states are broader than those of 502. For example, the voltage range of P1 overlaps with the voltage range of P2 in a voltage range 510, which is wider than the voltage range 508. Therefore, after the coarse programming of the neighboring memory cell, it is more likely that the threshold voltage of the memory cell is in an overlapping voltage range, such as the voltage range 510.

In some aspects, the memory cell can perform fine programming to further program the memory cell to be in one of 16 states. For example, 506 of FIG. 5 shows 16 voltage ranges of the fine programming that the threshold voltage of the memory cell may be in. It can be seen that the voltage ranges of the 16 states do not overlap with each other. Therefore, the memory device is able to determine which state the memory cell is in and thus determine the data stored in the memory cell. In some aspects, a memory cell has a target state, such as the state P1. In such a case, the memory cell corresponds to a target voltage range or a target voltage of the state P1. The target voltage range can be the distribution of state P1 shown in 506 of FIG. 5. For example, if the memory device program the memory cell so that its threshold voltage is within the target voltage range of the state P1, the programming of the memory cell is complete. In some aspects, the target voltage can be a lower bound of the target voltage range. If the memory device program the memory cell so that its threshold voltage is higher than the target voltage of the state P1, the programming of the memory cell is complete. In some aspects, the target voltage of a state, such as the state P1, can be the same or different from the coarse target voltage of the state.

Figure 12:
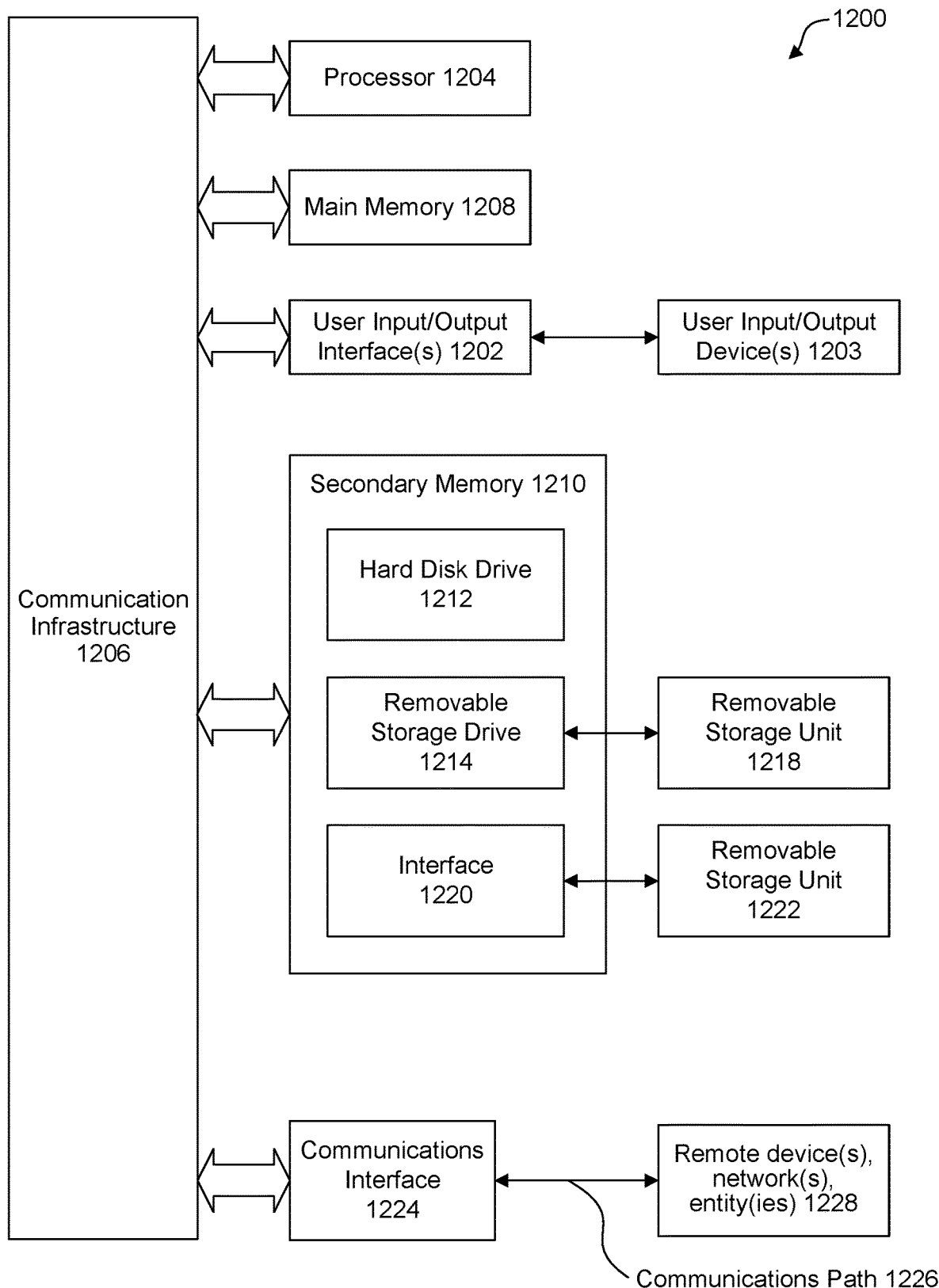
FIG. 12 is an example computer system for implementing some aspects of the disclosure or portion(s) thereof.

The example threshold voltage distributions 500 can also be performed by the computer system 1200 of FIG. 12. But example threshold voltage distributions 500 is not limited to the specific aspects depicted in those figures and other systems can be used to perform the method, as will be understood by those skilled in the art. It is to be appreciated that not all operations may be needed, and the operations may not be performed in the same order as shown in FIG. 5.

Figure 6:
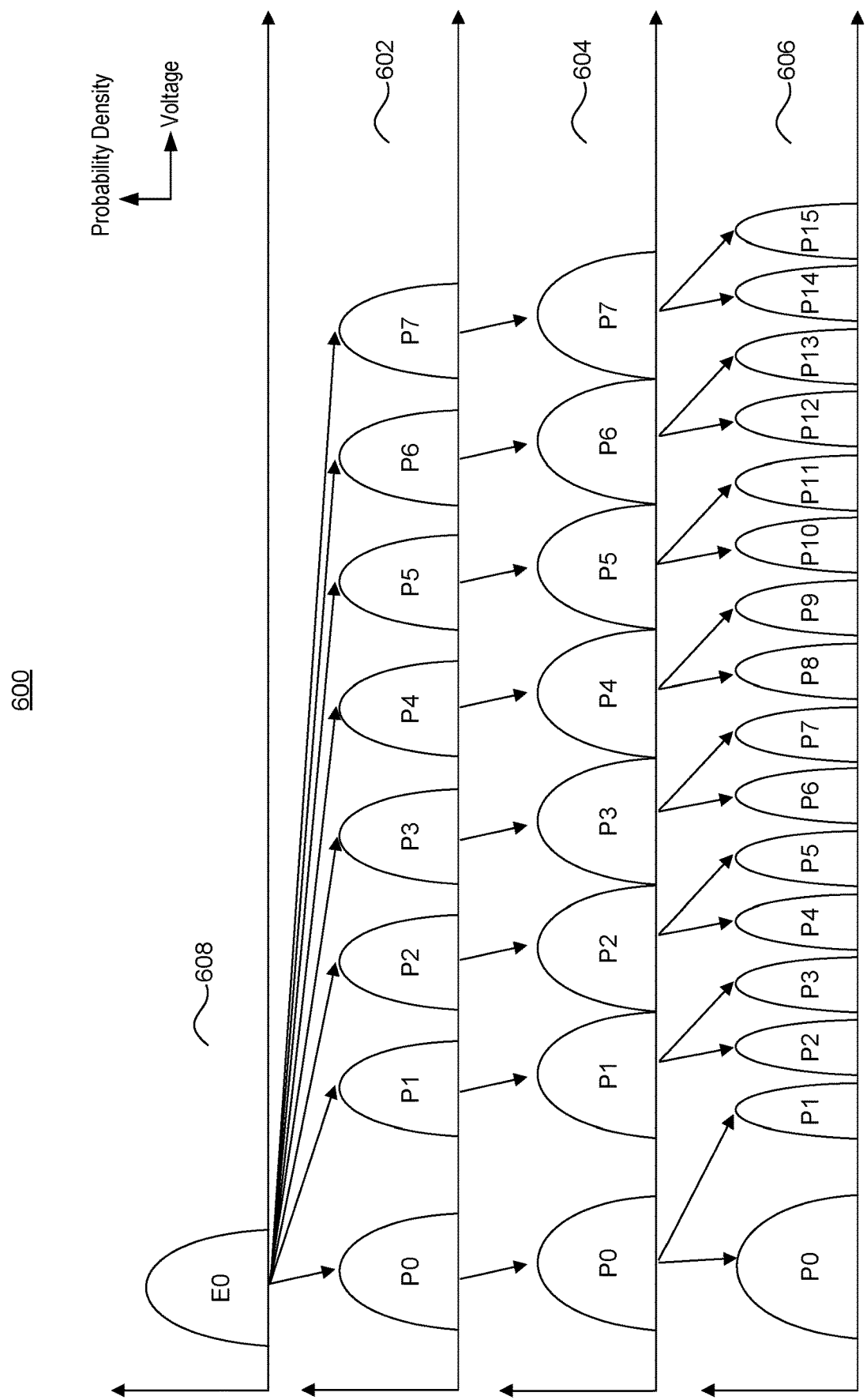
FIG. 6 illustrates an example threshold voltage distributions of a memory cell in 8-16 multi-stage programming, according to aspects of the present disclosure.

FIG. 6 illustrates an example threshold voltage distributions 600 of a memory cell in 8-16 multi-stage programming, according to aspects of the present disclosure. FIG. 6 can be described with regard to elements of FIGS. 1, 2, 3, and 12. The example threshold voltage distributions 600 can be performed by a memory system (for example, the memory system 102 of FIG. 1). The example threshold voltage distributions 600 includes plots 608, 602, 604, and 606. Each of the plots include an x-axis representing voltages levels and a y-axis representing probability densities. The plot 608 shows a threshold voltage distribution of the memory cell before performing any programming operations. The plot 602 shows the threshold voltage distribution of the memory cell after coarse programming of the memory cell. The plot 604 shows the threshold voltage distribution of the memory cell after coarse programming of a neighboring cell. The plot 606 shows the threshold voltage distribution of the memory cell after fine programming of the memory cell. Arrows between the plots represent possible changes between states. For example, arrows between an E0 of 608 and states P0-P7 of 602 shows that the threshold voltage of the memory cell can be programmed from the E0 state to any of the states P0-P7 in coarse programming.

In some aspects, a memory cell can store data in a QLC mode. In such a case, the memory cell can be programed to be in one of 16 states, namely, the P0-P16 states. The memory cell can be in the E0 state and the threshold voltage distribution of the memory cell in the E0 state is shown in 608. In some aspects, the P0 state is also referred to as an ER state. The memory device can perform a coarse program to program the memory cell from the E0 state to one of the 8 states P0-P7 so that the threshold voltage distribution can be in one of 8 voltage ranges corresponding to the states P0-P7 of 602. In some aspects, the 8 voltage ranges do not overlap with each other. In such a case, the memory device can determine which state the memory cell is in. However, because the memory cell is in the QLC mode, 8 states are not sufficient to represent 16 values. Thus, further programming is required.

In some aspects, after the coarse programming of the memory cell shown in 602, the memory device can perform coarse programming of the neighboring memory cell. For example, the memory cell can be connected to a word line n and the neighboring cell can be connected to a word line n+1. Therefore, the memory cell and the neighboring cell can be physically located close to each other in the memory device. In such a case, the coarse programming of the neighboring memory cell can have a coupling effect on the memory cell. For example, 604 of FIG. 6 shows the 8 voltage ranges of the coarse programming that the threshold voltage of the memory cell may be in after the coarse programming of the neighboring memory cell. It can be seen that each of the 8 voltage ranges of 604 is broader than those of 602. In addition, the 8 voltage ranges of 604 may touch or slightly overlap with each other. In such a case, the memory device is still likely to be able to determine which state the memory cell is in.

In some aspects, the memory cell can perform fine programming to further program the memory cell into one of 16 states. For example, 606 of FIG. 6 shows 16 voltage ranges of the fine programming that the threshold voltage of the memory cell may be in. Specifically, each of the voltage ranges of 604 is programmed into one of two voltage ranges. For example, the voltage range of the P1 state in 604 is programmed in the two possible voltage ranges, namely voltage ranges of P2 and P3 states in 606. It can be seen that the voltage ranges of the 16 states do not overlap with each other. Therefore, the memory device is able to determine which state the memory cell is in and thus determine the data stored in the memory cell.

The example threshold voltage distributions 600 can also be performed by the computer system 1200 of FIG. 12. But the example threshold voltage distributions 600 is not limited to the specific aspects depicted in those figures and other systems can be used to perform the method, as will be understood by those skilled in the art. It is to be appreciated that not all operations may be needed, and the operations may not be performed in the same order as shown in FIG. 6.

Figure 7:
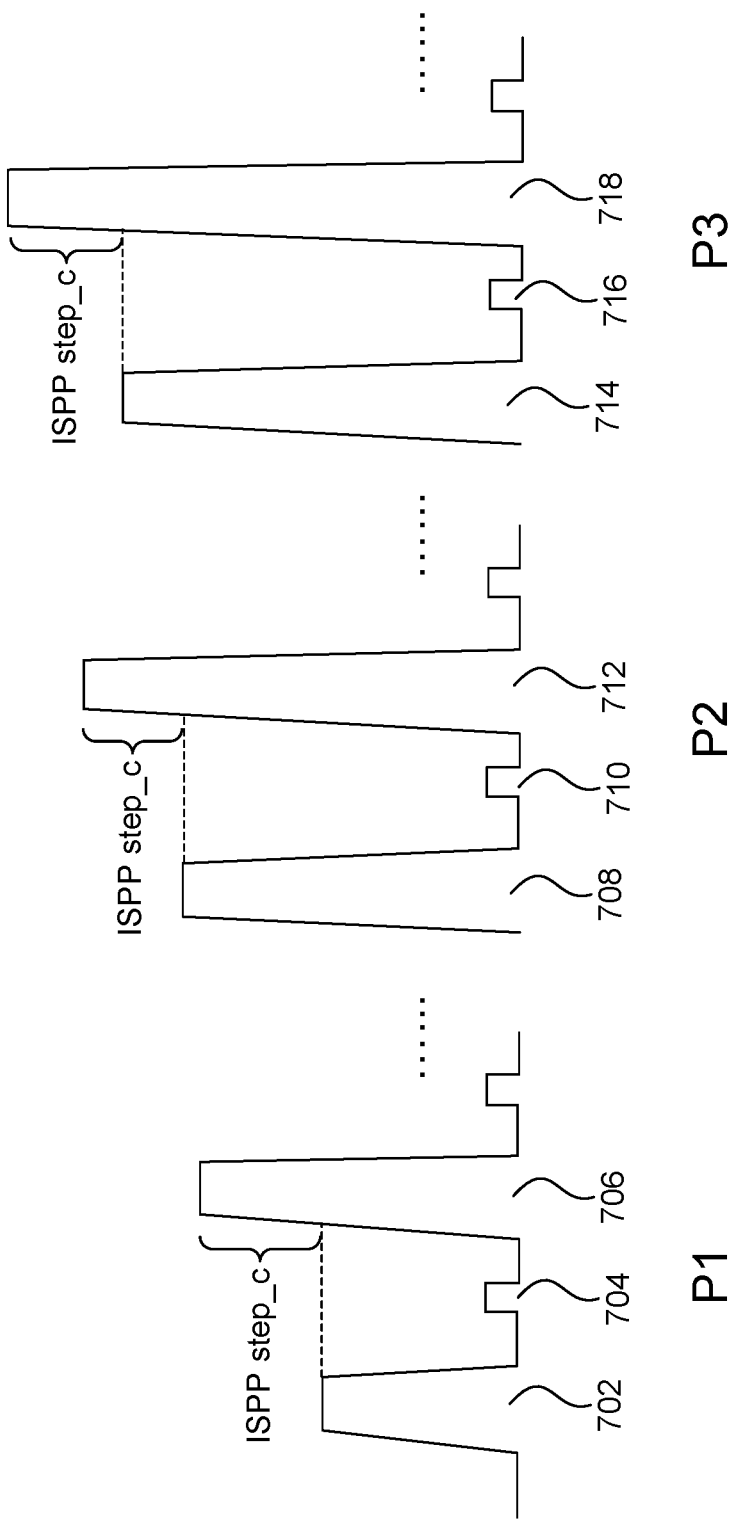
FIG. 7 illustrates an example of coarse programming with a fixed step pulse, according to aspects of the present disclosure.

FIG. 7 illustrates an example 700 of coarse programming with a fixed step pulse, according to aspects of the present disclosure. FIG. 7 can be described with regard to elements of FIGS. 1, 2, 3, and 12. The example 700 can be performed by a memory system (for example, the memory system 102 of FIG. 1).

In some aspects, during coarse programming, the memory device can apply different programming voltages to memory cells to program the memory cells into different states. For example, as shown in FIG. 7, the memory cell may have a target state of the state P1. In such a case, the memory device can apply a programming voltage 702 to the memory cell to program the memory cell to the state P1. As shown in FIGS. 5 and 6, a voltage range corresponds to the state P1 in the coarse programming. Therefore, the memory device applies a reference voltage 704 to verify whether the threshold voltage of the memory cell satisfies the voltage range. If the threshold voltage of the memory cell satisfies the voltage range, the coarse programming of the memory cell is complete. For example, the memory device may determine that the threshold voltage of the memory cell is within the voltage range and therefore satisfies the voltage range. In some aspects, the voltage range corresponds to a coarse target voltage. The memory device may determine that the threshold voltage of the memory cell is higher than the coarse target voltage and therefore satisfies the voltage range. In some aspects, the memory device inhabits the memory cell for the coarse programming when the coarse programming of the memory cell is complete. Thus, the memory device will not apply programming voltages to the memory cell in further coarse programming. On the other hand, the memory device may determine that the threshold voltage of the memory cell does not satisfy the voltage range. For example, the memory device may determine that the threshold voltage of the memory cell is outside the voltage range. For another example, the memory device may determine that the threshold voltage of the memory cell is lower than the coarse target voltage. In either cases, the memory device increases the programming voltage by a step pulse and applies the increased programming voltage to the memory cell. For example, the memory device increases the programming voltage 702 to a program voltage 706 by a step pulse, such as ISPP step_c. The memory device then applies the programming voltage 706 to the memory cell, after which the memory device verifies whether the threshold of the memory cell satisfies the voltage range. The memory device repeats the programming process until the threshold of the memory device satisfies the voltage range. The programming operations that apply the programming voltage in an incremental manner as discussed above are also referred to as ISPP.

In some aspects, the target state of the memory cell can be the state P2. The memory cell programs the memory cell to the state P1 prior to programing to the state P2. For example, when programing other memory cells with a target state P1, the memory device also programs memory cells with other target states, such as the memory cell with the target state P2, given that the memory cell is not inhabited. The memory cell can program the memory cell using the program voltage 702, reference voltage 704, and the program voltage 706 as discussed above. After programing the memory cell to the state P1, the memory device can apply a programming voltage 708 to the memory cell to program the memory cell to the state P2. As shown in FIGS. 5 and 6, the voltage range corresponding to the state P2 includes higher voltage values compared with the state P1. Thus, the programming voltage 708 is larger than the programming voltage 702. In some aspects, similar to the state P1, a second voltage range corresponds to the state P2 in the coarse programming. Therefore, the memory device can apply a reference voltage 710 to verify whether the threshold voltage of the memory cell satisfies the second voltage range. If the threshold voltage of the memory cell satisfies the second voltage range, the coarse programming of the memory cell is complete. In some aspects, the memory device inhabits the memory cell for the coarse programming. Thus, the memory device will not apply programming voltages to the memory cell in further coarse programming. On the other hand, if the threshold voltage of the memory cell does not satisfy the second voltage range, the memory device can increase the programming voltage by a step pulse and applies the increased programming voltage to the memory cell. For example, the memory device increases the programming voltage 708 to a program voltage 712 by a step pulse, such as ISPP step_c. The memory device then applies the programming voltage 712 to the memory cell, after which the memory device verifies whether the threshold of the memory cell satisfies the second voltage range. The memory device repeats the programming process until the threshold of the memory device satisfies the second voltage range. In some aspects, the step pulse of programming the memory cell to the P1 state is the same as the step pulse of programming the memory cell to the P2 state. In other words, the coarse programming uses ISPP with a fixed step pulse, e.g., ISPP step_c of FIG. 7.

In some aspects, when the memory device programs memory cells with the target state P2, the memory device also programs other cells with a higher target state, such as memory cells with a target state P3.

In some aspects, the memory device can skip memory cells with lower target states, such as the state P1. For example, one or more memory cells may complete the coarse programing to the state P1 and inhabited. In such a case, the memory cell can skip the one or more memory cells when programing with a higher target state, such as the states P2, P3, etc.

In some aspects, the target state of the memory cell can be the state P3. Similar to discussions above, prior to programing the memory cell to the state P3, the memory device first programs the memory cell to the state P1 and subsequently to the state P2. In other words, the memory cell can program the memory cell using the program voltage 702, reference voltage 704, the program voltage 706, the program voltage 708, the reference voltage 710, and the program voltage 712, as discussed above. After programing the memory cell to the state P2, the memory device can apply a programming voltage 714 to the memory cell to program the memory cell to the state P3. Similar to the states P1 and P2 discussed above, a third voltage range corresponds to the state P3 in the coarse programming. Therefore, the memory device can apply a reference voltage 716 to verify whether the threshold voltage of the memory cell satisfies the third voltage range. If the threshold voltage of the memory cell does not satisfy the third voltage range, the memory device can increase the programming voltage by a step pulse and applies the increased programming voltage to the memory cell. For example, the memory device increases the programming voltage 714 to a program voltage 718 by a step pulse, such as ISPP step_c. The memory device then applies the programming voltage 718 to the memory cell, after which the memory device verifies whether the threshold of the memory cell satisfies the third voltage range. The memory device repeats the programming process until the threshold of the memory device satisfies the third voltage range.

Figure 8:
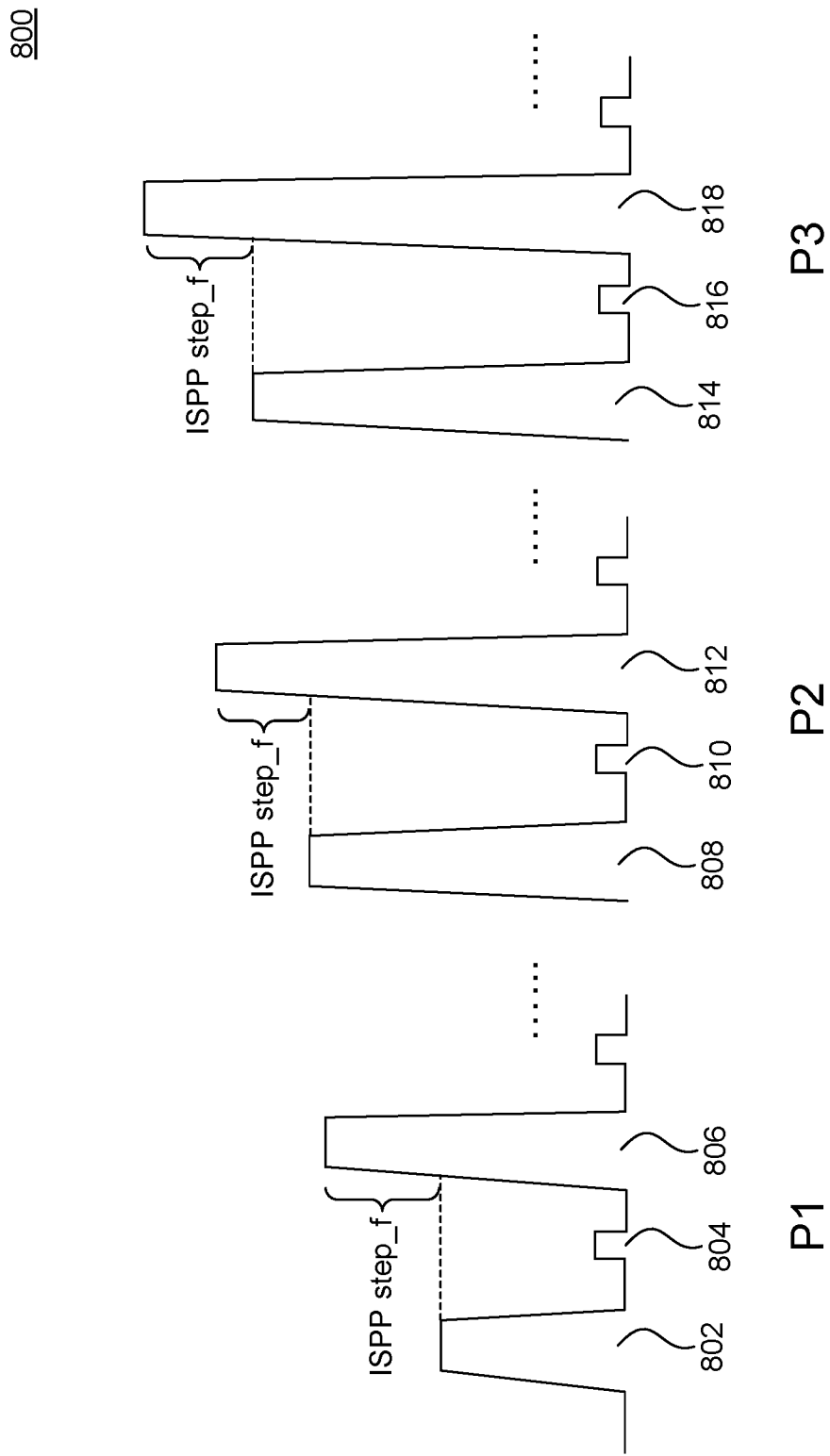
FIG. 8 illustrates an example of fine programming with a fixed step pulse, according to aspects of the present disclosure.

FIG. 8 illustrates an example of fine programming with a fixed step pulse, according to aspects of the present disclosure. FIG. 8 can be described with regard to elements of FIGS. 1, 2, 3, and 12. The example 800 can be performed by a memory system (for example, the memory system 102 of FIG. 1).

In some aspects, during fine programming, the memory device can apply different programming voltages to memory cells to program the memory cells into different states. Similar to the coarse programming discussed in FIG. 7, the memory device applies programming voltages 802, 808, or 814 to the memory cell. The memory device then verifies using references voltages 804, 810, or 816. If the memory cell fails to satisfy required states P1, P2, or P3, the memory device increases the programming voltages by ISPP step_f, which is different from ISPP step_c, and repeats the programming process until the memory cell satisfies the required states.

Figure 9:
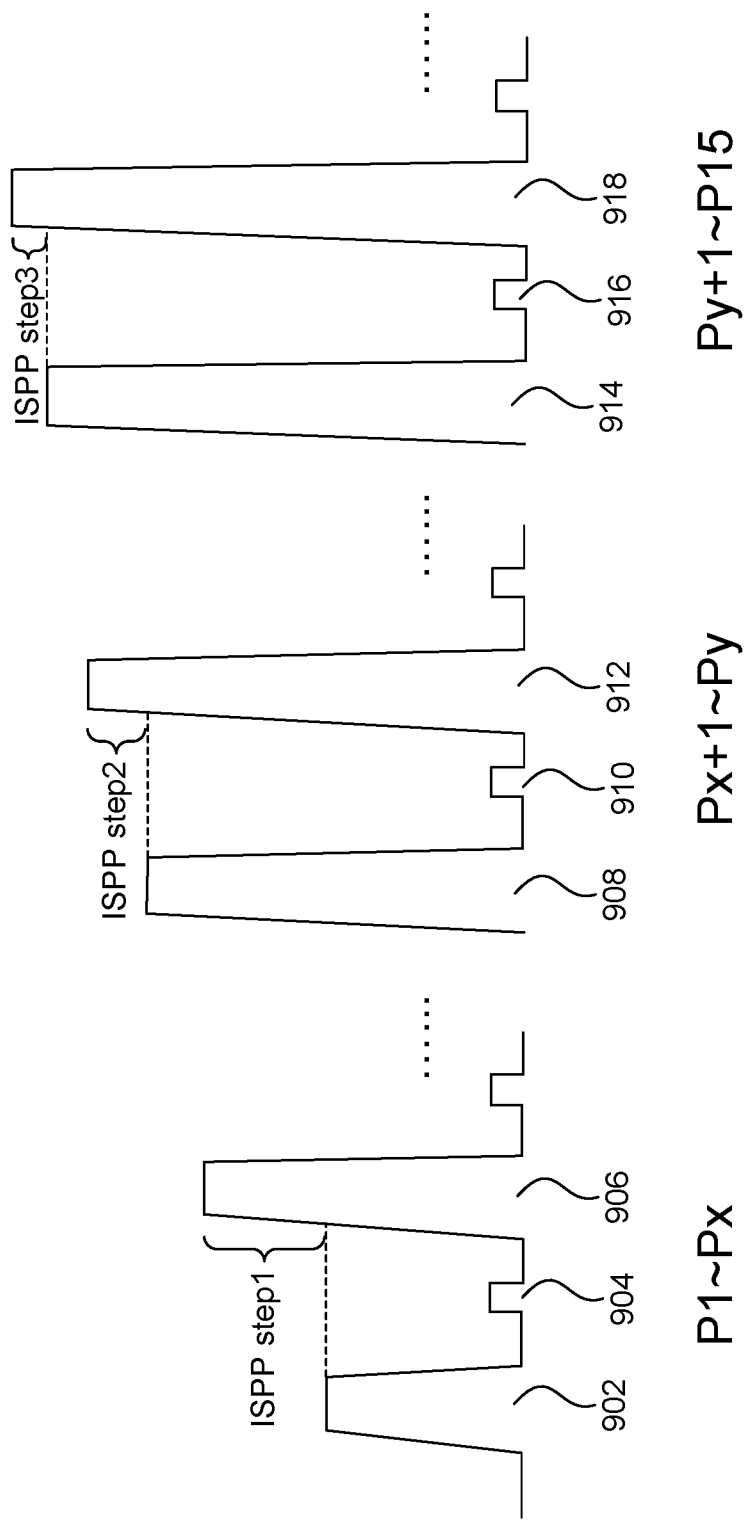
FIG. 9 illustrates an example of coarse programming with a variable step pulse, according to aspects of the present disclosure.

FIG. 9 illustrates an example 900 of a coarse programming with a variable step pulse, according to aspects of the present disclosure. FIG. 9 can be described with regard to elements of FIGS. 1, 2, 3, and 12. The example 900 can be performed by a memory system (for example, the memory system 102 of FIG. 1).

In some aspects, during coarse programming, the memory device can apply different programming voltages to memory cells to program the memory cells into different states. For example, as shown in FIG. 9, the memory cell may have a target state of the state P1. In such a case, the memory device can apply a programming voltage 902 to the memory cell to program the memory cell to the state P1. As shown in FIGS. 5 and 6, a voltage range corresponds to the state P1 in the coarse programming. Therefore, the memory device applies a reference voltage 904 to verify whether the threshold voltage of the memory cell satisfies the voltage range. If the threshold voltage of the memory cell satisfies the voltage range, the coarse programming of the memory cell is complete. In some aspects, the memory device inhabits the memory cell for the coarse programming. Thus, the memory device will not apply programming voltages to the memory cell in further coarse programming. On the other hand, if the threshold voltage of the memory cell does not satisfy the voltage range, the memory device increases the programming voltage by a step pulse and applies the increased programming voltage to the memory cell. For example, the memory device increases the programming voltage 902 to a program voltage 906 by a step pulse, such as ISPP step1. The memory device then applies the programming voltage 906 to the memory cell, after which the memory device verifies whether the threshold of the memory cell satisfies the voltage range. The memory device repeats the programming process until the threshold of the memory device satisfies the voltage range. The programming operations that apply the programming voltage in an incremental manner as discussed above are also referred to as ISPP.

In some aspects, the memory device determines that the step pulse to be ISPP step1 based on the target state of the memory cell. For example, if the target state is between the state P1 and a state Px, the memory device determines that the step pulse is ISPP step1. In some aspects, the state Px can be any of states between the state P2 and the state P13 shown in 502 of FIG. 5. For example, the state Px can be the state P6. In such a case, if the target state of the memory cell is any of the states P1-P6, the memory device determines that the step pulse is ISPP step1. In some aspects, the memory device can determine the step pulse based on the voltage range of the memory cell. For example, the threshold voltage of the memory cell may need to satisfy the voltage range or the target voltage as discussed above. If the voltage range or the target voltage is within a first step voltage range, the memory device determines that the step pulse is ISPP step1. For example, the first step voltage range can be formed by voltage ranges of the states P1-P6 as shown in 502 of FIG. 5. In some aspects, the first step voltage range can be any voltage that is lower than the upper bound of the voltage range of the state P6. In such a case, the voltage range of P1 would be within the first step voltage range and the memory device can determine the step pulse to be ISPP step1. For example, the target voltage of P1 is lower than an upper bound of the first step voltage range. In some aspects, as shown in 502 of FIG. 5, the voltage ranges of states P6 and P7 overlap in the coarse programming. Therefore, if the first step voltage range is determined based on the upper bound of the voltage range of the state P6, a part of the voltage range of the state P7 is also included in the first step voltage range.

In some aspects, the first step voltage range can be determined based on the lower bound of the voltage range of the state P7. For example, the first step voltage range can be any voltage that is lower than the lower bound of the voltage range of the state P7. In such a case, a part of the voltage range of the state P6 is not included in the first step voltage range. In some aspects, the first step voltage range can be determined based on the upper bound of the voltage range of the state P6 and the lower bound of the voltage range of the state P7. For example, the memory device can determine a cut-off voltage that is a mid-point of the upper bound of the voltage range of the state P6 and the lower bound of the voltage range of the state P7. The first step voltage range can be any voltage that is lower than the cut-off voltage.

In some aspects, the ISPP step1 is larger than a predetermined step pulse, such as ISPP step_c of FIG. 7. For example, the ISPP step1 can be 130% of the ISPP step_c. A larger step size, such as the ISPP step1, can expedite the coarse programing for lower states, such as state P1-Px. On the other hand, the ISPP step1>ISPP step2>ISPP step3. Therefore, in higher states, such as the states Py+1 to P15, setting the step size to be a smaller value improves accuracy of the coarse programing.

In some aspects, the target state of the memory cell can be the state Px+1, such as the state P7. In such a case, the memory device can program the memory cell through states P1-P6 and apply a programming voltage 908 to the memory cell to program the memory cell to the state P7. A memory cell with a higher target state is first programed to lower target states. For example, as discussed above, a memory cell with a target state P3 is first programed to states P1 and P2. As shown in FIGS. 5 and 6, the voltage range corresponding to the state P7 includes higher voltage values compared with the state P1. Thus, the programming voltage 908 is larger than the programming voltage 902. In some aspects, similar to the state P1, a second voltage range corresponds to the state P7 in the coarse programming. Therefore, the memory device can apply a reference voltage 910 to verify whether the threshold voltage of the memory cell satisfies the second voltage range. If the threshold voltage of the memory cell satisfies the second voltage range, the coarse programming of the memory cell is complete. In some aspects, the memory device inhabits the memory cell for the coarse programming. Thus, the memory device will not apply programming voltages to the memory cell in further coarse programming. On the other hand, if the threshold voltage of the memory cell does not satisfy the second voltage range, the memory device can increase the programming voltage by a step pulse and applies the increased programming voltage to the memory cell. For example, the memory device increases the programming voltage 908 to a program voltage 912 by a step pulse, such as ISPP step2. The memory device then applies the programming voltage 912 to the memory cell, after which the memory device verifies whether the threshold of the memory cell satisfies the second voltage range. The memory device repeats the programming process until the threshold of the memory device satisfies the second voltage range. In some aspects, the step pulse of programming the memory cell to the P1 state is different from the step pulse of programming the memory cell to the P7 state. In other words, the coarse programming applies ISPP with a variable step pulse. In some aspects, the ISPP step2 is larger than a predetermined step pulse, such as ISPP step_c of FIG. 7. For example, the ISPP step2 can be 120% of the ISPP step_c. In some aspects, a step pulse of a higher state is smaller than a step pulse of a lower state. For example, ISPP step2 is smaller than ISPP step1 as shown in FIG. 9.

In some aspects, the memory device determines that the step pulse is ISPP step2 based on the target state of the memory cell. For example, if the target state is between the state Px+1 and a state Py, the memory device determines that the step pulse is ISPP step2. For example, the state Px+1 can be the state P7 and the state Py can be the state P11 shown in 502 of FIG. 5. In such a case, if the target state of the memory cell is any of the states P7-P11, the memory device determines that the step pulse is ISPP step2. In some aspects, the memory device can determine the step pulse based on the voltage range of the memory cell. For example, the threshold voltage of the memory cell may need to satisfy the voltage range as discussed above. If the voltage range or the target voltage is within a second step voltage range, the memory device determines that the step pulse is ISPP step2. For example, the second step voltage range can be formed by voltage ranges of the states P7-P11 as shown in 502 of FIG. 5. In some aspects, the second voltage range can be any voltage that is higher than the lower bound of the voltage range of the state P7 and lower than the upper bound of the voltage range of the state P11. In such a case, the voltage range of P7 would be within the second step voltage range and the memory device can determine the step pulse to be ISPP step2. In some aspects, as shown in 502 of FIG. 5, the voltage ranges of states P6 and P7 overlap in the coarse programming. Therefore, if the second step voltage range is partly determined based on the lower bound of the voltage range of the state P7, a part of the voltage range of the state P6 is also included in the second step voltage range.

In some aspects, the second step voltage range can be determined partly based on the upper bound of the voltage range of the state P6. For example, the second step voltage range can be any voltage that is higher than the upper bound of the voltage range of the state P6 and lower than the upper bound of the voltage range of the state P11. In such a case, a part of the voltage range of the state P7 is not included in the second step voltage range. In some aspects, the second step voltage range can be determined partly based on the upper bound of the voltage range of the state P6 and the lower bound of the voltage range of the state P7. For example, the memory device can determine a cut-off voltage that is a mid-point of the upper bound of the voltage range of the state P6 and the lower bound of the voltage range of the state P7. The second step voltage range can be any voltage that higher than the cut-off voltage and lower than the upper bound of the voltage range of the state P11. In a similar manner, an upper bound of the second step voltage range can be determined based on the upper bound of the voltage range of the state P11, the lower bound of the voltage range of the state P12, or a mid-point of the upper bound of the voltage range of the state P11 and the lower bound of the voltage range of the state P12.

In some aspects, the target state of the memory cell can be the state Py+1, such as the state P12. In such a case, the memory device can apply a programming voltage 914 to the memory cell to program the memory cell to the state P12. As shown in FIGS. 5 and 6, the voltage range corresponding to the state P12 includes higher voltage values compared with the states P1 and P7. Thus, the programming voltage 914 is larger than the programming voltages 902 and 908. In some aspects, similar to the state P1, a third voltage range corresponds to the state P12 in the coarse programming. Therefore, the memory device can apply a reference voltage 916 to verify whether the threshold voltage of the memory cell satisfies the third voltage range. If the threshold voltage of the memory cell satisfies the third voltage range, the coarse programming of the memory cell is complete. In some aspects, the memory device inhabits the memory cell for the coarse programming. Thus, the memory device will not apply programming voltages to the memory cell in further coarse programming. On the other hand, if the threshold voltage of the memory cell does not satisfy the third voltage range, the memory device can increase the programming voltage by a step pulse and applies the increased programming voltage to the memory cell. For example, the memory device increases the programming voltage 914 to a program voltage 918 by a step pulse, such as ISPP step3. The memory device then applies the programming voltage 918 to the memory cell, after which the memory device verifies whether the threshold of the memory cell satisfies the third voltage range. The memory device repeats the programming process until the threshold of the memory device satisfies the third voltage range. In some aspects, the step pulse of programming the memory cell to the P12 state is different from the step pulse of programming the memory cell to the P7 state. In other words, the coarse programming uses ISPP with a variable step pulse. In some aspects, the ISPP step3 is larger than a predetermined step pulse, such as ISPP step_c of FIG. 7. For example, the ISPP step3 can be 110% of the ISPP step_c. In other aspects, the ISPP step3 can be the same as the ISPP step_c. In some aspects, a step pulse of a higher state is smaller than a step pulse of a lower state. For example, ISPP step3 is smaller than ISPP step1 and ISPP step2 as shown in FIG. 9. In other apsects, the ISPP step2 and ISPP step3 can be smaller than the predetermined step pulse. The overall programing speed using the ISPP step1, the ISPP step_2, and the ISPP step_3 can be faster than programing speed using the predetermined step pulse, such as the ISPP step_c.

In some aspects, the memory device determines that the step pulse is ISPP step3 based on the target state of the memory cell. For example, if the target state is between the state Py+1 and a state P15, the memory device determines that the step pulse is ISPP step3. For example, the state Py+1 can be the state P12. In such a case, if the target state of the memory cell is any of the states P12-P15, the memory device determines that the step pulse is ISPP step3. In some aspects, the memory device can determine the step pulse based on the voltage range of the memory cell. For example, the threshold voltage of the memory cell may need to satisfy the voltage range as discussed above. If the voltage range is within a third step voltage range, the memory device determines that the step pulse is ISPP step3. For example, the third step voltage range can be formed by voltage ranges of the states P12-P15 as shown in 502 of FIG. 5. In some aspects, the third step voltage range can be any voltage that is higher than the lower bound of the voltage range of the state P12. In such a case, the voltage range of P12 would be within the third step voltage range and the memory device can determine the step pulse is ISPP step3. In some aspects, as shown in 502 of FIG. 5, the voltage ranges of states P11 and P12 overlap in the coarse programming. Therefore, if the third step voltage range is determined based on the lower bound of the voltage range of the state P12, a part of the voltage range of the state P11 is also included in the third step voltage range.

In some aspects, the third step voltage range can be determined based on the upper bound of the voltage range of the state P11. For example, the third step voltage range can be any voltage that is higher than the upper bound of the voltage range of P11. In such a case, a part of the voltage range of the state P12 is not included in the third step voltage range. In some aspects, the third step voltage range can be determined based on the lower bound of the voltage range of the state P12 and the upper bound of the voltage range of the state P11. For example, the memory device can determine a cut-off voltage that is a mid-point of the lower bound of the voltage range of the state P12 and the upper bound of the voltage range of the state P11. The third step voltage range can be any voltage that is higher than the cut-off voltage.

In some aspects, the Px and Py can have other values. For example, Px can be P3 and Py can be P10. In other aspects, the memory device can program using other number of step pulses. For example, the memory device can program memory cells to states P1-P3 using ISPP step_1; program memory cells to states P4-P6 using ISPP step_2; program memory cells to states P7-P10 using ISPP step_3; program memory cells to states P11-P13 using ISPP step 4; and program memory cells to states P14-P15 using ISPP step_5.

Figure 10:
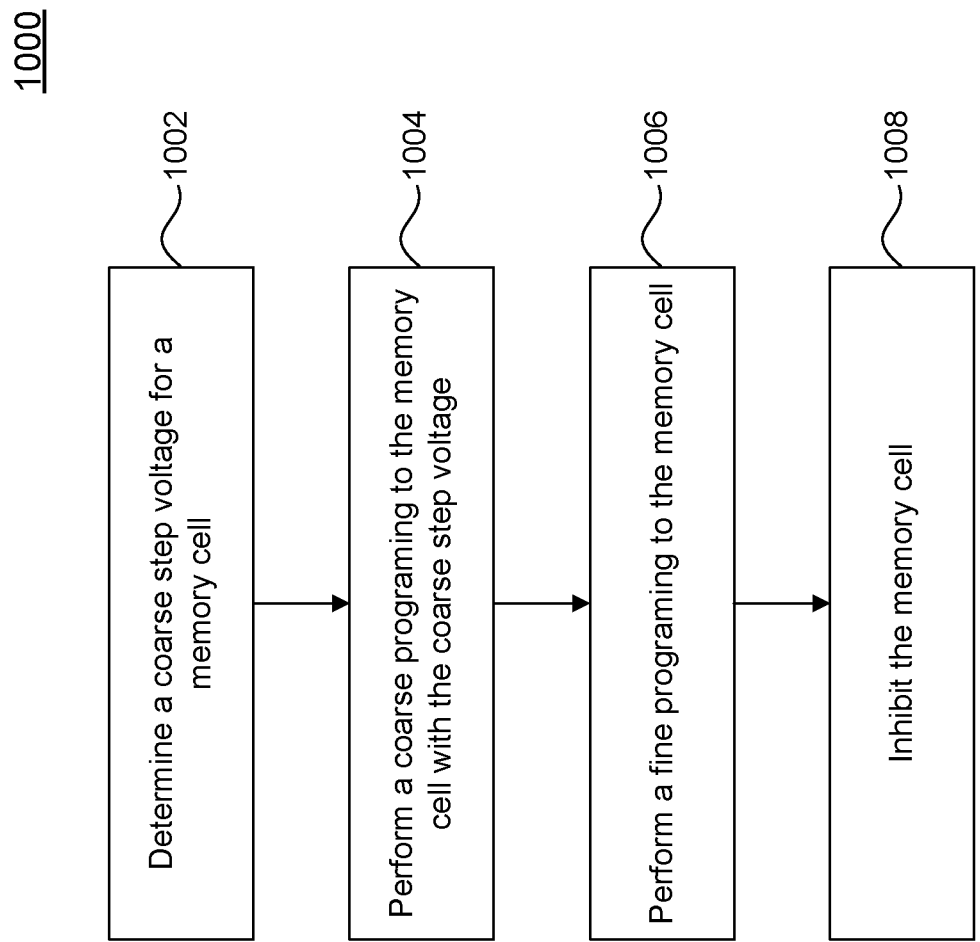
FIG. 10 illustrates an example method of multi-stage programming operations, according to aspects of the present disclosure.

FIG. 10 illustrates an example method of multi-stage programming operations, according to aspects of the present disclosure. As a convenience and not a limitation, FIG. 10 can be described with regard to elements of FIGS. 1, 2, 3, and 12. The example method 1000 can be performed by a memory system (for example, the memory system 102 of FIG. 1). The example 1000 can also be performed by the computer system 1200 of FIG. 12. But example 1000 is not limited to the specific aspects depicted in those figures and other systems can be used to perform the method, as will be understood by those skilled in the art. It is to be appreciated that not all operations may be needed, and the operations may not be performed in the same order as shown in FIG. 10.

At 1002, the memory device determines a coarse step voltage for the memory cell. In some aspects, the memory device determines the coarse step voltage based on the target state or the voltage range corresponding to the memory cell as discussed above in FIG. 9.

At 1004, the memory device performs coarse programming to the memory cell with the coarse step voltage. In some aspects, the memory device performs ISPP with the coarse step voltage until the threshold of the memory cell satisfies the voltage range of the memory cell.

At 1006, the memory device performs fine programming to the memory cell. In some aspects, the memory device performs ISPP with a predetermined fine step voltage.

At 1008, the memory device inhibits the memory cell. In some aspects, the memory device inhibits the memory cell from further coarse programming by raising the voltage on the corresponding bit lines.

Figure 11:
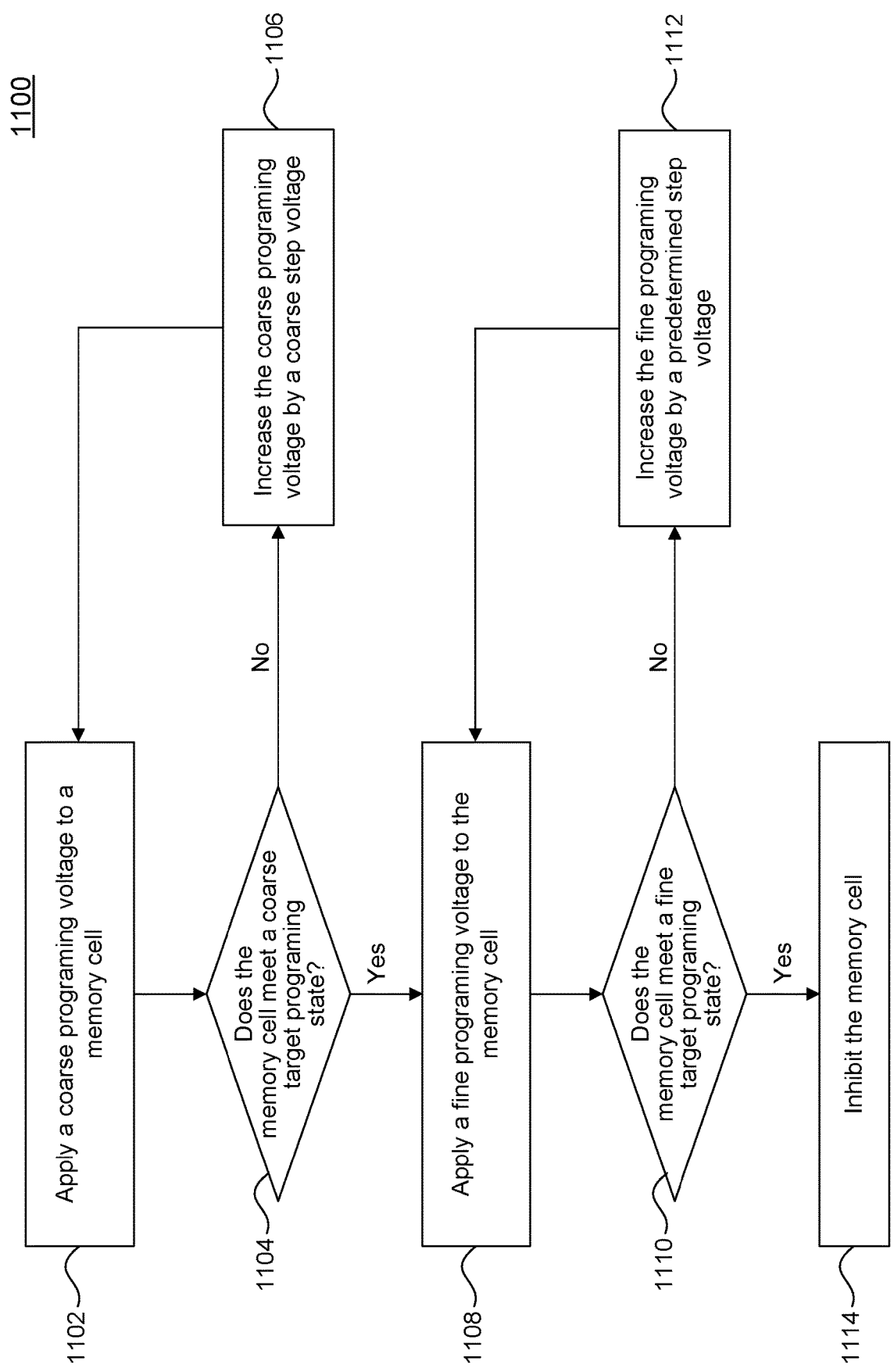
FIG. 11 illustrates another example method of multi-stage programming operations, according to aspects of the present disclosure.

FIG. 11 illustrates another example method of multi-stage programming operations, according to aspects of the present disclosure. As a convenience and not a limitation, FIG. 11 can be described with regard to elements of FIGS. 1, 2, 3, and 12. The example method 1100 can be performed by a memory system (for example, the memory system 102 of FIG. 1). The example 1100 can also be performed by the computer system 1200 of FIG. 12. But example 1100 is not limited to the specific aspects depicted in those figures and other systems can be used to perform the method, as will be understood by those skilled in the art. It is to be appreciated that not all operations may be needed, and the operations may not be performed in the same order as shown in FIG. 11.

At 1102, the memory device applies a coarse programming voltage to the memory cell. In some aspects, the memory device determines the coarse programming voltage based on the target state of the memory cell. For example, a memory cell corresponding to a higher target state has a higher coarse programming voltage.

At 1104, the memory device determines whether the memory cell meets a coarse target programming state. For example, the memory cell may have a target state P1, which corresponds to a coarse voltage range. The memory device applies various reference voltages to determine a threshold voltage of the memory cell as discussed above. If the threshold voltage does not satisfy the coarse voltage range, the control moves to 1106.

At 1106, the memory device increases the coarse programming voltage by a coarse step voltage. In some aspects, the coarse step voltage is a variable step voltage determined by the memory device as discussed in 1002 of FIG. 10.

Referring back to 1104, if the memory device determines that the threshold voltage of the memory cell satisfies the coarse voltage range, the control moves to 1108.

At 1108, the memory device applies a fine programming voltage to the memory cell. In some aspects, the memory device determines the fine programming voltage based on the target state of the memory cell. For example, a memory cell corresponding to a higher target state has a higher fine programming voltage.

At 1110, the memory device determines whether the memory cell meets a fine target programming state. For example, the memory cell may have a target state P1, which corresponds to fine voltage range. The memory device applies various reference voltages to determine the threshold voltage of the memory cell as discussed above. If the threshold voltage does not satisfy the coarse voltage range, the control moves to 1112.

At 1112, the memory device increases the fine programming voltage by a predetermined step voltage.

Referring back to 1110, if the memory device determines that the threshold voltage of the memory cell satisfies the fine voltage range, the control moves to 1114.

At 1114, the memory device inhibits the memory cell. In some aspects, the memory device inhibits the memory cell from further programming by raising the voltage on the corresponding bit lines.

Various aspects can be implemented, for example, using one or more computer systems, such as computer system 1200 shown in FIG. 12. Computer system 1200 can be any well-known computer capable of performing the functions described herein such as the memory system 102 of FIG. 1. Computer system 1200 includes one or more processors (also called central processing units, or CPUs), such as a processor 1204. Processor 1204 is connected to a communication infrastructure 1206 (e.g., a bus.) Computer system 1200 also includes user input/output device(s) 1203, such as monitors, keyboards, pointing devices, etc., that communicate with communication infrastructure 1206 through user input/output interface(s) 1202. Computer system 1200 also includes a main or primary memory 1208, such as random access memory (RAM). Main memory 1208 can include one or more levels of cache. Main memory 1208 has stored therein control logic (e.g., computer software) and/or data.

Computer system 1200 can also include one or more secondary storage devices or memory 1210. Secondary memory 1210 can include, for example, a hard disk drive 1212 and/or a removable storage device or drive 1214. Removable storage drive 1214 can be a floppy disk drive, a magnetic tape drive, a compact disk drive, an optical storage device, tape backup device, and/or any other storage device/drive.

Removable storage drive 1214 can interact with a removable storage unit 1218. Removable storage unit 1218 includes a computer usable or readable storage device having stored thereon computer software (control logic) and/or data. Removable storage unit 1218 can be a floppy disk, magnetic tape, compact disk, DVD, optical storage disk, and/any other computer data storage device. Removable storage drive 1214 reads from and/or writes to removable storage unit 1218 in a well-known manner.

According to some aspects, secondary memory 1210 can include other means, instrumentalities or other approaches for allowing computer programs and/or other instructions and/or data to be accessed by computer system 1200. Such means, instrumentalities or other approaches can include, for example, a removable storage unit 1222 and an interface 1220. Examples of the removable storage unit 1222 and the interface 1220 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1200 can further include a communication or network interface 1224. Communication interface 1224 enables computer system 1200 to communicate and interact with any combination of remote devices, remote networks, remote entities, etc. (individually and collectively referenced by reference number 1228). For example, communication interface 1224 can allow computer system 1200 to communicate with remote devices 1228 over communications path 1226, which can be wired and/or wireless, and which can include any combination of LANs, WANs, the Internet, etc. Control logic and/or data can be transmitted to and from computer system 1200 via communication path 1226.

The operations in the preceding aspects can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, computer system 1200, main memory 1208, secondary memory 1210 and removable storage units 1218 and 1222, as well as tangible articles of manufacture embodying any combination of the foregoing. Such control logic, when executed by one or more data processing devices (such as computer system 1200), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 12. In particular, aspects can operate with software, hardware, and/or operating system implementations other than those described herein.

In summary, the present disclosure describes various aspects of a memory storage system and methods of making the same.

Some aspects of this disclosure provide a memory system with a memory device and a controller, wherein the memory device comprises a first cell and a second cell. The controller comprises a processor, which is configured to perform a first programming to a first cell of the memory device by incremental step pulse programming (ISPP) with a first step voltage. The processor is further configured to perform a second programming to a second cell of the memory device by ISPP with a second step voltage. The first step voltage is larger than the second step voltage. The first cell corresponds to a first target voltage and the second cell corresponds to a second target voltage. The first cell corresponds to a first target voltage and the second cell corresponds to a second target voltage. In some aspects, the first programing and the second programing can be a same type of programing. For example, the first programing can be a first coarse programing and the second programing can be a second coarse programing.

Some aspects of this disclosure relate to the memory system, wherein to perform the first programming to the first cell, the processor is further configured to apply a first programming voltage to the first cell; determine that a voltage level of the first cell is lower than a coarse target voltage; increase the first programming voltage by the first step voltage to be an increased first programing voltage; apply the increased first programming voltage to the first cell; and determining that the voltage level of the first cell is higher than the coarse target voltage.

Some aspects of this disclosure relate to the memory system, wherein the processor is further configured to: perform a third programming to the first cell by ISPP with a predetermined step voltage and perform a fourth programming to the second cell by ISPP with the predetermined step voltage.

Some aspects of this disclosure relate to the memory system, wherein to perform the third programming to the first cell, the processor is further configured to apply a second programming voltage to the first cell; determine that a voltage level of the first cell is lower than the first target voltage; increase the second programming voltage by the predetermined step voltage to be an increased second programing voltage; apply the increased second programming voltage to the first cell; and determine that the voltage level of the first cell is higher than the first target voltage.

Some aspects of this disclosure relate to the memory system, wherein the processor is further configured to inhibit the first cell in response to determining that the voltage level of the first cell is higher than the first target voltage.

Some aspects of this disclosure relate to the memory system, wherein the processor is further configured to: perform a fifth programming to a third cell of the memory device by ISPP with a third step voltage, wherein the third step voltage is smaller than the first and the second step voltages.

Some aspects of this disclosure relate to the memory system, wherein the processor is further configured to perform a third fine programming to the third cell by ISPP with a predetermined step voltage.

Some aspects of this disclosure relate to the memory system, wherein the third cell corresponds to a third target voltage and wherein the third target voltage is larger than the first and the second target voltages.

Some aspects of this disclosure relate to the memory system, wherein the processor is further configured to determine the first step voltage based on the first target voltage.

Some aspects of this disclosure relate to the memory system, wherein to determine the first step voltage based on the first target voltage, the processor is further configured to determine that the first target voltage is lower than an upper bound of a step voltage range.

Some aspects of this disclosure relate to the memory system, the processor is further configured to determine the second step voltage by determining that the second target voltage is higher than a lower bound of a second step voltage range and lower than an upper bound of the second step voltage range.

Some aspects of this disclosure relate to the memory system, the processor is further configured to determine the third step voltage by determining that the third target voltage is higher than a lower bound of a third step voltage range.

Some aspects of this disclosure provide a method for operating a memory device comprising performing a first programming to a first cell of the memory device by ISPP with a first step voltage; and performing a second programming to a second cell of the memory device by ISPP with a second step voltage; wherein the first step voltage is larger than the second step voltage, wherein the first cell corresponds to a first target voltage and the second cell corresponds to a second target voltage, and wherein the first target voltage is lower than the second target voltage. In some aspects, the first programing and the second programing can be a same type of programing. For example, the first programing can be a first coarse programing and the second programing can be a second coarse programing.

Some aspects of this disclosure provide the method for operating the memory device, wherein performing the first programming to the first cell further comprises applying a first programming voltage to the first cell, determining that a voltage level of the first cell is lower than a coarse target voltage, and increasing the first programming voltage by the first step voltage to be an increased first programing voltage. The performing the first programming to the first cell further comprises applying the increased first programming voltage to the first cell and determining that the voltage level of the first cell is higher than the coarse target voltage.

Some aspects of this disclosure provide the method for operating the memory device, further comprising performing a third programming to the first cell by ISPP with a predetermined step voltage; and performing a fourth programming to the second cell by ISPP with the predetermined step voltage.

Some aspects of this disclosure provide the method for operating the memory device, wherein performing the third programming to the first cell further comprises: applying a second programming voltage to the first cell; determining that a voltage level of the first cell is lower than the first target voltage; increasing the second programming voltage by the predetermined step voltage to be an increased second programming voltage; applying the increased second programming voltage to the first cell; and determining that the voltage level of the first cell is higher than the first target voltage.

Some aspects of this disclosure provide the method for operating the memory device, further comprising in response to determining that the voltage level of the first cell is higher than the first target voltage, inhibiting the first cell.

Some aspects of this disclosure provide the method for operating the memory device, further comprising: performing a fifth programming to a third cell of the memory device by ISPP with a third step voltage. The third step voltage is smaller than the first and the second step voltages.

Some aspects of this disclosure provide the method for operating the memory device, further comprising: performing a sixth programming to the third cell by ISPP with a predetermined step voltage.

Some aspects of this disclosure provide the method for operating the memory device, wherein the third cell corresponds to a third target voltage and wherein the third target voltage is larger than the first and the second target voltages.

Some aspects of this disclosure provide the method for operating the memory device, further comprising determining the first step voltage based on the first target voltage.

Some aspects of this disclosure provide the method for operating the memory device, wherein determining the first step voltage based on the first target voltage comprises determining that the first target voltage is lower than an upper bound of a step voltage range.

Some aspects of this disclosure provide the method for operating the memory device, further comprising determining the second step voltage by determining that the second target voltage is higher than a lower bound of a second step voltage range and lower than an upper bound of the second step voltage range.

Some aspects of this disclosure provide the method for operating the memory device, determining the third step voltage by determining that the third target voltage is higher than a lower bound of a third step voltage range.

Some aspects of this disclosure provide a non-transitory computer-readable medium (CRM) comprising instructions to, upon execution of the instructions by one or more processors of a memory device, cause the memory device to perform operations, the operations comprising performing a first programming to a first cell of the memory device by incremental step pulse programming (ISPP) with a first step voltage; and performing a second programming to a second cell of the memory device by ISPP with a second step voltage; wherein the first step voltage is larger than the second step voltage, wherein the first cell corresponds to a first target voltage and the second cell corresponds to a second target voltage, and wherein the first target voltage is lower than the second target voltage.

Some aspects of this disclosure provide the non-transitory CRM, wherein performing the first programming to the first cell further comprises: applying a first programming voltage to the first cell; determining that a voltage level of the first cell is lower than a coarse target voltage; increasing the first programming voltage by the first step voltage to be an increased first programing voltage; applying the increased first programming voltage to the first cell; and determining that the voltage level of the first cell is higher than the coarse target voltage.

Some aspects of this disclosure provide the non-transitory CRM, wherein the operations further comprise: performing a third programming to the first cell by ISPP with a predetermined step voltage; and performing a fourth programming to the second cell by ISPP with the predetermined step voltage.

Some aspects of this disclosure provide the non-transitory CRM, wherein performing the third programming to the first cell further comprises: applying a second programming voltage to the first cell; determining that a voltage level of the first cell is lower than the first target voltage; increasing the second programming voltage by the predetermined step voltage to be an increased second programing voltage; applying the increased second programming voltage to the first cell; and determining that the voltage level of the first cell is higher than the first target voltage.

Some aspects of this disclosure provide the non-transitory CRM, wherein the operations further comprise in response to determining that the voltage level of the first cell is higher than the first target voltage, inhibiting the first cell.

Some aspects of this disclosure provide the non-transitory CRM, wherein the operations further comprise: performing a fifth programming to a third cell of the memory device by ISPP with a third step voltage, wherein the third step voltage is smaller than the first and the second step voltages.

Some aspects of this disclosure provide the non-transitory CRM, wherein the operations further comprise performing a sixth programming to the third cell by ISPP with a predetermined step voltage.

Some aspects of this disclosure provide the non-transitory CRM, wherein the third cell corresponds to a third target voltage and wherein the third target voltage is larger than the first and the second target voltages.

Some aspects of this disclosure provide the non-transitory CRM, wherein the operations further comprise determining the first step voltage based on the first target voltage.

Some aspects of this disclosure provide the non-transitory CRM, wherein determining the first step voltage based on the first target voltage comprises determining that the first target voltage is lower than an upper bound of a step voltage range.

Some aspects of this disclosure provide the non-transitory CRM, wherein the operations further comprise determining the second step voltage by determining that the second target voltage is higher than a lower bound of a second step voltage range and lower than a an upper bound of the second step voltage range.

Some aspects of this disclosure provide the non-transitory CRM, wherein the operations further comprise determining the third step voltage by determining that the third target voltage is higher than a lower bound of a third step voltage range.

Some aspects of this disclosure provide a memory device comprising peripheral circuit and a memory array. The peripheral circuit, coupled to the memory array, is configured to perform a first programming to a first cell of the memory device by ISPP with a first step voltage. The peripheral circuit is further configured to perform a second programming to a second cell of the memory device by ISPP with a second step voltage. The first step voltage is larger than the second step voltage. The first cell corresponds to a first target voltage and the second cell corresponds to a second target voltage. The first cell corresponds to a first target voltage and the second cell corresponds to a second target voltage. In some aspects, the first programing and the second programing can be a same type of programing. For example, the first programing can be a first coarse programing and the second programing can be a second coarse programing.

The Summary and Abstract sections can set forth one or more but not all exemplary aspects of the present disclosure as contemplated by the inventor(s), and thus, are not intended to limit the present disclosure and the appended claims in any way.

While the disclosure has been described herein with reference to exemplary aspects for exemplary fields and applications, it should be understood that the disclosure is not limited thereto. Other aspects and modifications thereto are possible, and are within the scope and spirit of the disclosure. For example, and without limiting the generality of this paragraph, aspects are not limited to the software, hardware, firmware, and/or entities illustrated in the figures and/or described herein. Further, aspects (whether or not explicitly described herein) have significant utility to fields and applications beyond the examples described herein.

Aspects have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. In addition, alternative aspects can perform functional blocks, steps, operations, methods, etc. using orderings different from those described herein.

References herein to "one aspect," "an aspect," "an example aspect," or similar phrases, indicate that the aspect described can include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it would be within the knowledge of persons skilled in the relevant art(s) to incorporate such feature, structure, or characteristic into other aspects whether or not explicitly mentioned or described herein.

The breadth and scope of the disclosure should not be limited by any of the above-described exemplary aspects, but should be defined only in accordance with the following claims and their equivalents.

What is claimed is:

1. A method of operating a memory device, the method comprising:
   determining a first step voltage based on a first target voltage of a first cell;
   determining a second step voltage based on a second target voltage of a second cell;
   performing a first programming to the first cell of the memory device by incremental step pulse programming (ISPP) with the first step voltage by:
      applying a first programming voltage to the first cell;
      determining that a voltage level of the first cell is lower than a coarse target voltage;
      increasing the first programming voltage by the first step voltage to be an increased first programing voltage;
      applying the increased first programming voltage to the first cell; and
      determining that the voltage level of the first cell is higher than the coarse target voltage;
   performing a second programming to the second cell of the memory device by ISPP with the second step voltage;
   responsive to the voltage level of the first cell being higher than the coarse target voltage, performing a third programming to the first cell by ISPP with a predetermined step voltage by:
      applying a second programming voltage to the first cell;
      determining that a voltage level of the first cell is lower than the first target voltage;
      increasing the second programming voltage by the predetermined step voltage to be an increased second programing voltage;
      applying the increased second programming voltage to the first cell; and
      determining that the voltage level of the first cell is higher than the first target voltage,
   wherein the first step voltage is larger than the second step voltage, the predetermined step voltage is less than the first step voltage, and
   the coarse target voltage is lower than the first target voltage.

2. The method of claim 1, further comprising:
   performing a fourth programming to the second cell by ISPP with the predetermined step voltage.

3. The method of claim 1, further comprising in response to determining that the voltage level of the first cell is higher than the first target voltage, inhibiting the first cell.

4. The method of claim 1, further comprising:
   performing a fifth programming to a third cell of the memory device by ISPP with a third step voltage, and wherein the third step voltage is smaller than the first and the second step voltages.

5. The method of claim 4, further comprising:
   performing a sixth programming to the third cell by ISPP with a predetermined step voltage.

6. The method of claim 4, wherein:
   the third cell corresponds to a third target voltage, and the third target voltage is larger than the first and the second target voltages.

7. The method of claim 6, wherein determining the first step voltage based on the first target voltage comprises determining that the first target voltage is lower than an upper bound of a step voltage range.

8. The method of claim 1, further comprising determining the first step voltage based on the first target voltage.

9. The method of claim 1, further comprising determining the second step voltage by determining that the second target voltage is higher than a lower bound of a second step voltage range and lower than an upper bound of the second step voltage range.

10. The method of claim 6, further comprising:
    determining the third step voltage by determining that the third target voltage is higher than a lower bound of a third step voltage range.

11. The method of claim 1, wherein the first target voltage is associated with a first memory cell target state, the second target voltage is associated with a second memory cell target state, the second memory cell target state is a higher memory cell target state than the first memory cell target state, and the second step voltage is determined to have a value greater than the first step voltage resulting from the second memory cell target state being the higher memory cell target state than the first memory cell target state.

12. The method of claim 1, wherein the second step voltage is greater than the first step voltage responsive to the second target voltage being greater than the first target voltage.

13. A memory system with a memory device and a controller, wherein the memory device comprises a first cell and a second cell, the controller comprising:
    a processor configured to:
       determine a first step voltage based on a first target voltage of the first cell;
       determine a second step voltage based on a second target voltage of the second cell;
       perform a first programming to the first cell by incremental step pulse programming (ISPP) with the first step voltage by:
          applying a first programming voltage to the first cell;
          determining that a voltage level of the first cell is lower than a coarse target voltage;
          increasing the first programming voltage by the first step voltage to be an increased first programing voltage;
          applying the increased first programming voltage to the first cell; and
          determining that the voltage level of the first cell is higher than the coarse target voltage;
       perform a second programming to the second cell by the ISPP with the second step voltage;
       responsive to the voltage level of the first cell is higher than the coarse target voltage, performing a third programming to the first cell by ISPP with a predetermined step voltage by:

applying a second programming voltage to the first cell;
determining that a voltage level of the first cell is lower than the first target voltage;
increasing the second programming voltage by the predetermined step voltage to be an increased second programing voltage;
applying the increased second programming voltage to the first cell; and
determining that the voltage level of the first cell is higher than the first target voltage;
wherein the first step voltage is larger than the second step voltage, the predetermined step voltage is less than the first step voltage, and
the coarse target voltage is lower than the first target voltage.

14. The memory system of claim 13, wherein the processor is further configured to:
perform a fourth programming to the second cell by ISPP with the predetermined step voltage.

15. The memory system of claim 13, wherein the processor is further configured to inhibit the first cell in response to determining that the voltage level of the first cell is higher than the first target voltage.

16. The memory system of claim 13, wherein the processor is further configured to:
perform a fifth programming to a third cell of the memory device by ISPP with a third step voltage,
wherein the third step voltage is smaller than the first and the second step voltages.

17. The memory system of claim 16, wherein the processor is further configured to perform a sixth programming to the third cell by ISPP with a predetermined step voltage.

18. A memory device comprising peripheral circuit and a memory array, the peripheral circuit, coupled to the memory array, configured to:
determine a first step voltage based on a first target voltage of a first cell of the memory array;
determine a second step voltage based on a second target voltage of a second cell of the memory array;
perform a first programming to the first cell by incremental step pulse programming (ISPP) with the first step voltage by:
applying a first programming voltage to the first cell;
determining that a voltage level of the first cell is lower than a coarse target voltage;
increasing the first programming voltage by the first step voltage to be an increased first programing voltage;
applying the increased first programming voltage to the first cell; and
determining that the voltage level of the first cell is higher than the coarse target voltage;
perform a second programming to the second cell by the ISPP with the second step voltage;
responsive to the voltage level of the first cell is higher than the coarse target voltage, performing a third programming to the first cell by ISPP with a predetermined step voltage by:
applying a second programming voltage to the first cell;
determining that a voltage level of the first cell is lower than the first target voltage;
increasing the second programming voltage by the predetermined step voltage to be an increased second programing voltage;
applying the increased second programming voltage to the first cell; and
determining that the voltage level of the first cell is higher than the first target voltage,
wherein the first step voltage is larger than the second step voltage, the predetermined step voltage is less than the first step voltage, and
the coarse target voltage is lower than the first target voltage.

19. The method of claim 11, wherein performing the second programming to the second cell of the memory device by ISPP with the second step voltage comprises:
applying a second coarse programming voltage to the second cell;
determining that a voltage level of the second cell is lower than a second coarse target voltage, the second coarse target voltage greater than the coarse target voltage;
increasing the second coarse programming voltage by the second step voltage to be an increased second coarse programming voltage;
applying the increased second coarse programming voltage to the second cell; and
determining that the voltage level of the second cell is higher than the second coarse target voltage.

* * * * *